(12) United States Patent
Oohama

(10) Patent No.: US 7,009,291 B2
(45) Date of Patent: Mar. 7, 2006

(54) SEMICONDUCTOR MODULE AND SEMICONDUCTOR DEVICE

(75) Inventor: Kenichi Oohama, Ichinomiya (JP)

(73) Assignee: Denso Corporation, Kariya (JP)

( * ) Notice: Subject to any disclaimer, the term of this patent is extended or adjusted under 35 U.S.C. 154(b) by 224 days.

(21) Appl. No.: 10/744,787

(22) Filed: Dec. 24, 2003

(65) Prior Publication Data

US 2004/0183188 A1 Sep. 23, 2004

(30) Foreign Application Priority Data

Dec. 25, 2002 (JP) ............................. 2002-374434
Apr. 10, 2003 (JP) ............................. 2003-106831

(51) Int. Cl.
*H01L 23/34* (2006.01)

(52) U.S. Cl. ...................................... 257/712; 257/723

(58) Field of Classification Search ................ 257/706, 257/712, 723, 690, 678

See application file for complete search history.

(56) References Cited

U.S. PATENT DOCUMENTS

| 5,094,769 A | * | 3/1992 | Anderson et al. .............. 252/71 |
| 6,037,658 A | * | 3/2000 | Brodsky et al. ............. 257/707 |
| 6,542,365 B1 | | 4/2003 | Inoue |

FOREIGN PATENT DOCUMENTS

JP  A 2001-308263  11/2001

* cited by examiner

*Primary Examiner*—Roy Potter
(74) *Attorney, Agent, or Firm*—Oliff & Berridge, PLC

(57) ABSTRACT

In a semiconductor device, a semiconductor module contains a semiconductor element and having a radiating portion, and a heat absorbing member has a heat absorbing portion with heat conductivity. A grease member is interposed between the radiating portion of the semiconductor module and the heat absorbing portion of the heat absorbing member. The radiating portion and absorbing portion are opposite and close to each other through the grease member in a predetermined direction. A grease extrusion path has one end and other end portions and formed in at least one of the radiating portion and the heat absorbing portion. The one end portion of the grease extrusion path is configured to contact the grease member, said other end portion thereof communicates with an exterior of the at least one of the radiating portion and the heat absorbing portion.

23 Claims, 18 Drawing Sheets

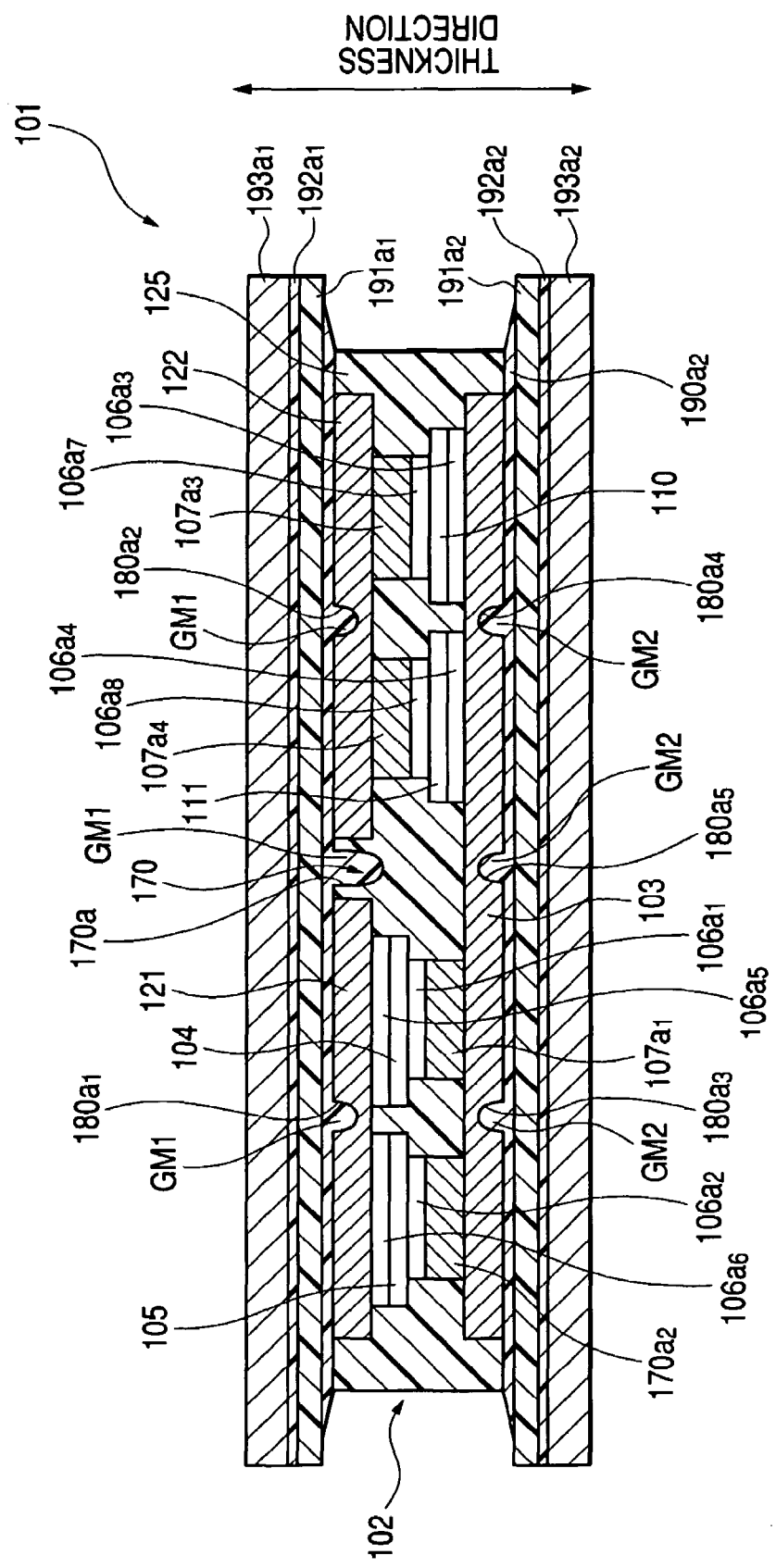

SEMICONDUCTOR MODULE AND SEMICONDUCTOR DEVICE

BACKGROUND OF THE INVENTION

The present invention relates to a semiconductor module and a semiconductor device containing the semiconductor module or a semiconductor chip. Incidentally, the expression "semiconductor module" means to include at least a semiconductor chip hereinafter.

In general semiconductor devices each containing a semiconductor module for use in power modules, the semiconductor module is closely adhered or soldered on a heat radiating member for radiating the heat generated from the semiconductor module.

Usually, in each of the semiconductor devices that employs the closely adherence structure of the semiconductor module on the heat radiating member, a grease member with excellent heat conductivity is applied on at least one of a contact surface of the semiconductor module and that of the heat conductive member, which are opposite to each other.

The grease member allows the heat conductivity between the semiconductor module and the heat radiating member to improve because the contact surfaces of the semiconductor module and the heat radiating member are fine uneven.

The structure in which the grease member is applied on the at least one of the contact surfaces of the semiconductor module and the heat radiating member is referred to simply as "grease application structure".

As an example of the semiconductor devices each with the grease application structure, the semiconductor device in which a single-phase inverter circuit for controlling an AC (alternate current) motor is built has been disclosed in U.S. Patent Publication 6542365 (Japanese Patent Publication 2001-308263).

The disclosed semiconductor device comprises a semiconductor module containing a single-phase circuit of a three-phase inverter circuit, that is, a half-bridge circuit, which is made modular.

In the semiconductor module, a first semiconductor chip constituting an upper arm of the single-phase circuit and a second semiconductor chip constituting a lower arm thereof are mounted on a middle-sided plate with heat and electric conductivity, middle-sided plate which is served as an AC terminal of the single-phase circuit. The first and second semiconductor chips are adjacently arranged in a longitudinal direction of the middle-sided plate.

A high-sided plate having heat and electric conductivity and constituting a high-sided terminal of the three-phase inverter circuit is disposed on the first semiconductor chip, and a low-sided plate having heat and electric conductivity and constituting a low-sided terminal of the three-phase inverter circuit is disposed on the second semiconductor chip. Resin is molded in the module to cover both side surfaces of the first and second semiconductor chips, the high-sided-plate, the low-sided-plate and the middle-sided-plate, respectively.

Then, in the disclosed semiconductor device, the upper surface of the semiconductor module (each of the upper surfaces of the high-sided plate and low-sided plate), on which a grease layer as the grease member is coated, is closely contacted to a first heat sink as the heat radiating member. In addition, the lower surface of the semiconductor module (the lower surface of the low-sided plat), on which a grease layer as the grease member is coated, is also closely contacted a second heat sink as the heat radiating member.

That is, the disclosed semiconductor device allows the semiconductor modules to be cooled from both upper and lower surfaces of each module.

To keep high each heat conductivity of each conventional semiconductor device with the grease application structure is necessary to apply the grease member as thin as possible on the at least one of the contact surfaces of each semiconductor module and each heat radiating member within the range that allows the applied grease member to be sufficiently filled in the fine uneven portions of the at least one of the contact surfaces and to compensate for the warp therein.

In the manufacturing process of each semiconductor device with the grease application structure, therefore, the grease member is coated on the at least one of the contact surfaces of the semiconductor module and the heat radiating member, and the contact surfaces of the semiconductor module and the heat radiating member are closely contacted to each other and are subjected to pressure in the contacting direction. The application of pressure to the laminated semiconductor module and the heat radiating member permits excess grease member to be driven out, thereby making thin the thickness of the grease member interposed between the contact surfaces of the semiconductor module and the heat radiating member as thin as possible.

The portion of the excess grease member especially located at the center portion of each contact surface needs to be driven out to the peripheral portion of each contact surface, but this driving out of excess grease member is difficult so that the excess grease member, which must be extruded, remains between the contact surfaces of the semiconductor module and the heat radiating member, causing the radiating ability of the semiconductor module to decrease.

If reducing the amount of grease member to be applied on the at least one of the contact surfaces of the semiconductor module and the heat radiating member to avoid the occurrence of the excess grease member, it is difficult to endure high heat conductivity between the semiconductor and the heat radiating member in cases where the at least one of the contact surfaces thereof has large unevenness and/or a large warp.

In contrast, if the thickness of the applied grease member on the at least one of the contact surfaces is too large, this causes the deterioration of the heat conductivity between the contact surfaces of the semiconductor module and the heat radiating member so that bubbles may occur therebetween.

Especially, in addition to the above issues, the disclosed semiconductor device may be apt to cause creepage discharge between the high-sided plate and the low-sided plate.

SUMMARY OF THE INVENTION

The present invention is made on the background.

Accordingly, it is an object of the present invention to provide a semiconductor device containing a semiconductor module, which is capable of closely contacting a contact surface of the semiconductor module to that of a heat radiating member without causing shortage of a grease member applied on at least one of the contact surfaces and excess of the grease member applied thereon.

It is another object of the present invention to provide a semiconductor module which is capable of preventing an occurrence of creepage discharge between electric plates.

According to one aspect of the present invention, there is provided a semiconductor device comprising: a semiconductor module containing a semiconductor element and having a radiating portion; a heat absorbing member having a heat absorbing portion with heat conductivity; a grease member interposed between the radiating portion of the semiconductor module and the heat absorbing portion of the heat absorbing member, the radiating portion and heat absorbing portion being opposite and close to each other through the grease member in a predetermined direction; and a grease extrusion path having one end and other end portions and formed in at least one of the radiating portion and the heat absorbing portion, the one end portion of the grease extrusion path being configured to contact the grease member, the other end portion thereof communicating with an exterior of the at least one of the radiating portion and the heat absorbing portion.

According to another aspect of the present invention, there is provided a semiconductor A semiconductor device comprising: a semiconductor module containing at least two semiconductor elements and having first and second radiating portions; a heat absorbing member having first and second heat absorbing portions each with heat conductivity; a first grease member interposed between the first radiating portion of the semiconductor module and the first heat absorbing portion of the heat absorbing member, the first radiating portion and first absorbing portion being opposite and close to each other through the first grease member in a predetermined direction; a second grease member interposed between the second radiating portion of the semiconductor module and the second heat absorbing portion of the heat absorbing member, the second radiating portion and second absorbing portion being opposite and close to each other through the second grease member in the predetermined direction; a first grease extrusion path having one end and other end portions and formed in at least one of the first radiating portion and the first heat absorbing portion, the one end portion of the first grease extrusion path being configured to contact the first grease member, the other end portion thereof communicating with an exterior of the at least one of the first radiating portion and the first heat absorbing portion; and a second grease extrusion path having one end and other end portions and formed in at least one of the second radiating portion and the second heat absorbing portion, the one end portion of the second grease extrusion path being configured to contact the second grease member, the other end portion thereof communicating with an exterior of the at least one of the second radiating portion and the second heat absorbing portion.

According to further aspect of the present invention, there is provided a semiconductor module containing at least first and second semiconductor chips of an electric circuit, comprising: a first electric plate with a mount surface on which the first and second semiconductor chips are mounted, respectively, the first electric plate having first and second longitudinal side surfaces opposite to each other; a second electric plate mounted on the first semiconductor chip, the second electric plate having first and second side surfaces opposite to each other and parallel to the first and second longitudinal side surfaces, respectively; a third electric plate mounted on the second semiconductor chip, the third electric plate having first and second side surfaces opposite to each other and parallel to the first and second longitudinal side surfaces, respectively; a first electric terminal projecting from one end portion of the first longitudinal side surface of the first electric plate in a lateral direction thereof, the first electric terminal constituting an alternate current terminal of the electric circuit; a second electric terminal projecting from a first portion of the first side surface of the second electric plate in the lateral direction, the first portion being spaced with respect to the one end portion in the longitudinal direction, the second electric terminal constituting a high-sided current terminal of the electric circuit; a third electric terminal projecting from a second portion of the first side surface of the third electric plate in the lateral direction, the second portion being spaced with respect to the one end portion and the first portion in the lateral direction, the third electric terminal constituting a low-sided current terminal of the electric circuit; a mold package having a first side surface corresponding to the first longitudinal side surface of the first electric plate and a second side surface corresponding to the second longitudinal side surface thereof, the mold package containing the first to third electric plates, the first and second semiconductor chips, respectively; a first low current terminal electrically connected to one of the first and second semiconductor chips and projecting from the second side surface of the mold package; and a second low current terminal electrically connected to other of the first and second semiconductor chips and projecting from the second side surface of the mold package.

According to still further aspect of the present invention, there is provided a semiconductor module containing at least first and second semiconductor chips of an electric circuit, comprising: a first electric plate with a mount surface on which the first and second semiconductor chips are mounted, respectively, the first electric plate having first, second, third and fourth side surfaces; a second electric plate mounted on one of the semiconductor chips, the second electric plate having first, second, third and fourth side surfaces parallel to the first, second, third and fourth side surfaces of the first electric plate, respectively; a third electric plate arranged in parallel to the first electric plate and mounted on another one of the semiconductor chips, the third electric plate having first, second, third and fourth side surfaces parallel to the first, second, third and fourth side surfaces of the first electric plate, respectively; a first electric terminal projecting from one of the first, second, third and fourth side surfaces of the first electric plate in a lateral direction thereof, the first electric terminal constituting an alternate current terminal of the electric circuit; a second electric terminal projecting from one of the first, second, third and fourth side surfaces of the second electric plate in the lateral direction, the second electric terminal constituting a high-sided current terminal of the electric circuit; a third electric terminal projecting from one of the first, second, third and fourth side surfaces of the third electric plate in the lateral direction, the third electric terminal constituting a low-sided current terminal of the electric circuit; a mold package having first, second, third and fourth side surfaces corresponding to the first, second, third and fourth side surfaces of the first electric plate, the mold package containing the first to third electric plates, the first and second semiconductor chips, respectively; a first low current terminal electrically connected to one of the first and second semiconductor chips; and a second low current terminal electrically connected to other of the first and second semiconductor chips, wherein the first electric terminal, second electric terminal, third electric terminal, and each of the first and second low current terminals project independently through the first, second, third, and fourth side surfaces of the mold package, respectively.

BRIEF DESCRIPTION OF THE DRAWINGS

Other objects and aspects of the invention will become apparent from the following description of an embodiment with reference to the accompanying drawings in which:

FIG. 18 is a cross sectional view illustrating a semiconductor device according to the fourth embodiment of the invention, which comprises the semiconductor module shown in FIGS. 10 to 17;

DETAILED DESCRIPTION OF EMBODIMENTS OF THE INVENTION

Embodiments of the semiconductor devices according to the invention will be described hereinafter with reference to the accompanying drawings.

(First Embodiment)

Figure 1:
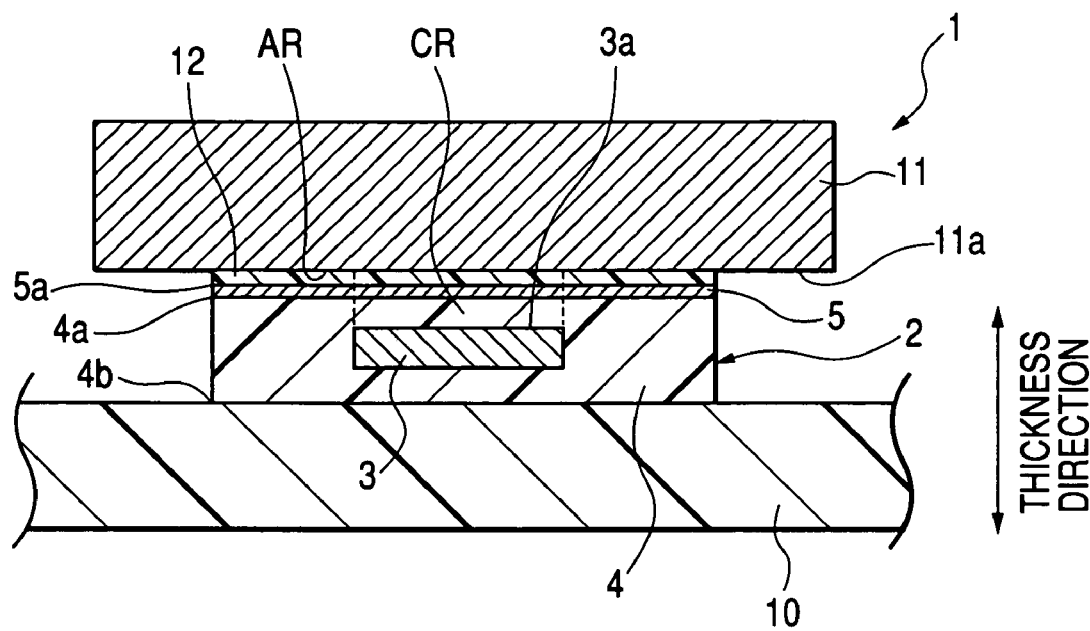
FIG. 1 is a cross sectional view of a semiconductor device according to a first embodiment of the invention.
Figure 2:
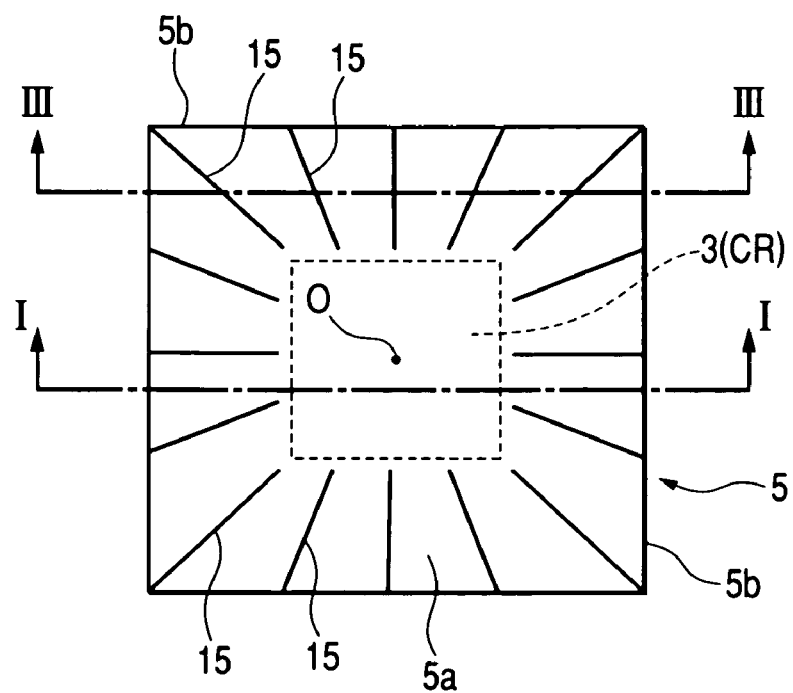
FIG. 2 is a plan view of a semiconductor module of the semiconductor device shown in FIG. 1.
Figure 3:
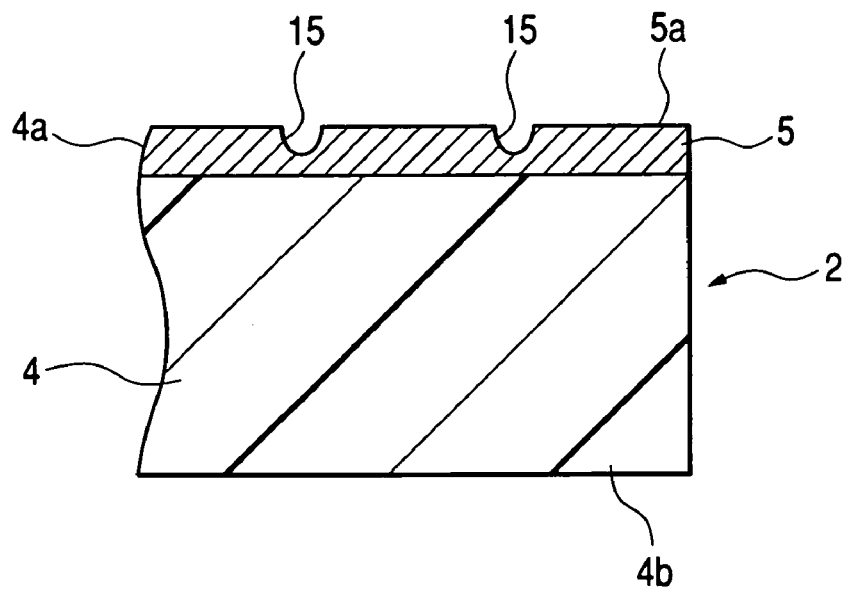
FIG. 3 is an enlarged cross sectional view taken on line III—III in FIG. 2.

FIG. 1 is a cross sectional view of a semiconductor device according to a first embodiment of the invention, FIG. 2 is a plan view of a semiconductor module of the semiconductor device shown in FIG. 1, and FIG. 3 is an enlarged cross sectional view taken on line III—III in FIG. 2. Incidentally, in FIG. 2, line I—I represents the cross line of the semiconductor device shown in FIG. 1.

The semiconductor device 1 according to the first embodiment comprises a semiconductor module 2. The semiconductor module 2 has a semiconductor die (chip) 3 having a plurality of semiconductor elements, and a substantially thin plate-like shaped mold package 4 containing at its substantially center portion the semiconductor chip 3 to protect it.

The semiconductor module 2 is also provided with a radiating metal plate 5 that is mounted on a top surface 4a of the mold package 4 so that the radiating metal plate 5 is exposed over the top surface 4a thereof. A top exposed surface 5a of the radiating metal plate 5 is served as a radiating surface.

The radiating metal plate 5 may be served as an electrode, and also may be mounted on a portion of the top surface 4a of the mold package 4. If the radiating metal plate 5 is mounted on the portion of the top surface 4a of the mold package 4, the rest of the top surface 4a may be made flush with the radiating surface 5a of the radiating metal plate 5, or stepped with respect to the radiating surface 5a of the radiating metal plate 5.

The semiconductor device 1 also comprises a wiring substrate 10 made of plastic or resin and having at least one of wiring layers electrically connected to the semiconductor elements in the semiconductor chip 3.

The wiring substrate 10 can be made of metal so as to be served as wiring members. If the wiring substrate 10 is made of metal, the semiconductor module 2 can be provided with a radiating metal plate that is formed on a bottom surface 4b of the mold package 4 so that the radiating metal plate is exposed over the bottom surface 4b thereof and joined or closely contacted to the wiring substrate 10.

The radiating metal plate may be formed on a portion of the bottom surface 4b of the mold package 4. When closely contacting the radiating metal plate to the wiring substrate made of metal, an electrical insulating film can be interposed between the radiating metal plate and the wiring substrate.

The semiconductor device 3 is further provided with a heat sink 11 made of a substantially rectangular parallelepiped aluminum or copper block and having one surface 11a (bottom surface shown in FIG. 1), and a heat conductive grease layer 12 mounted on the radiating surface 5a of the radiating metal plate 5 so that the heat sink 11 is mounted on the heat conductive grease layer 12, whereby a surface area AR of the bottom surface 11a, which is opposite to the radiating surface 5a through the grease layer 12, is closely contacted to the radiating surface 5a through the grease layer 12. The surface area AR of the bottom surface 11a of the heat sink 11 is referred to as "heat absorbing area AR". An electrical insulating film can be interposed between the heat absorbing area AR of the heat sink 11 and the grease layer 12.

In this first embodiment, the whole of top surface 5a of the radiating metal plate 5 constitutes the heat radiating surface so that the heat absorbing area AR of the heat sink 11 is closely contacted to the whole of top surface 5a of the radiating metal plate 5.

The grease layer 12 is made of a grease member with heat conductivity. The grease member may contain silver powders, or may be made of flexible material, such as gelled material.

That is, the heat sink 11 and the radiating metal plate 5 are thermally coupled to each other through the heat radiating surface 5a, the heat absorbing area AR and the grease layer 12 so that the heat sink 11 can absorb the heat generated from the semiconductor chip 3 therethrough to radiate the absorbed heat.

In addition, as shown in FIGS. 2 and 3, the semiconductor module 2 is also provided with a plurality of first grease extrusion grooves 15 concavely formed on the radiating surface 5a of the radiating metal plate 5. The first grease extrusion grooves 15 are disposed in the radial directions with respect to the center axis O of the radiating surface 5a at, for example, approximately regular intervals, respectively. The first grease extrusion grooves 15 surround a conductive region CR positioned between an upper surface 3a of the semiconductor chip 3 and a portion of the heat absorption area AR in the thickness direction, portion which is opposite to the upper surface 3a therein.

Each of the first grease extrusion grooves 15 extends from the circumference of the semiconductor chip 3 to a peripheral portion 5b of the radiating surface 5a of the radiating metal plate 5, that is, the peripheral portion of the semiconductor module 2, so as to communicate with the exterior of the semiconductor module 2.

In this fist embodiment, it is preferable that each of the first grease extrusion grooves 15 has a width from several micrometers (μm) to hundreds of micrometers, and a depth of hundreds of millimeters (mm), but can have a width and a depth which are more than the above ranges.

Next, the overall operations of the semiconductor device 1 with the first grease extrusion grooves 15 will be described hereinafter.

In this first embodiment, to form the grease layer 12 between the radiating surface 5a of the radiating metal plate 5 and the heat absorption area AR of the heat sink 11, the grease member with heat conductivity is applied on at least one of the radiating surface 5a of the radiating metal plate 5 and the heat absorption area AR of the heat sink 11. The radiating surface 5a of the radiating metal plate 5 and the heat absorption area AR of the bottom surface 11a of the heat sink 11 are closely contacted to each other and are subjected to pressure in the contacting direction. That is, the semiconductor module 1 is sandwiched between the heat sink 11 and the wiring substrate 10 at a predetermined pressure so that the grease layer 12 with a preferably predetermined thin thickness can be formed between the semiconductor module 2 (the radiating surface 5a of the radiating metal plate 5) and the heat sink 11 (the heat absorbing area AR thereof). Then, it is noted that semiconductor devices each having the above sandwiching structure are well-known and the sandwiching structure itself is not subject matter of this first embodiment so that the explanation of the sandwiching structure is omitted.

In this first embodiment, the application of pressure to the sandwiched semiconductor module 2 by the heat sink 11 and the wiring substrate 10 extrudes excess grease member located between the center portion of the radiating surface 5a and that of the heat absorption area AR outwardly through the periphery of the center portions.

Figure 4:
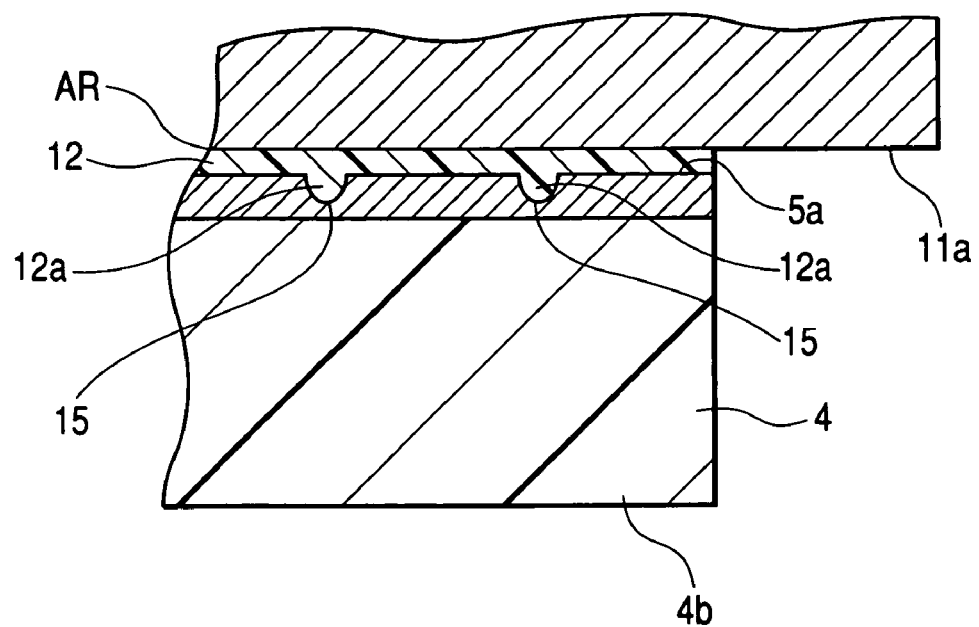
FIG. 4 is an enlarged cross sectional view illustrating the semiconductor device corresponding to FIG. 3.

At that time, in this first embodiment, the first grease extrusion grooves 15 are radially disposed to surround the conductive region CR, that is, disposed at the periphery of the center portions of the radiating surface 5a and the heat absorption area AR, so that the outwardly extruded excess grease member 12a is divided to be introduced into the first grease extrusion grooves 15, as shown in FIG. 4.

Because each of the first grease extrusion grooves 15 extends to the peripheral portion 5b of the radiating metal plate 5 so as to communicate with the exterior of the semiconductor module 2, the introduced excess grease members 12a are extruded through the corresponding grease extraction grooves 15 toward the exterior of the semiconductor module 2, respectively.

As a result, it is possible to apply sufficient grease member on the at least one of the radiating surface 5a of the radiating metal plate 5 and the heat absorption area AR of the heat sink 11 without the possibility that the excess grease member remains between the center portions of the radiating surface 5a of the radiating metal plate 5 and the heat absorption area AR of the heat sink 11.

In addition, after applying sufficiently the grease member on the at least one of the radiating surface 5a of the radiating metal plate 5 and the heat absorption area AR of the heat sink 11, the first grease extrusion grooves 15 allow the excess grease member 12a to be driven out from the semiconductor module 2 immediately without applying strong pressure to the semiconductor module 2 in a long time, making it possible to improve the radiating ability of the semiconductor module 2 of the semiconductor device 1.

Moreover, in this first embodiment, the first grease extrusion grooves 15 are disposed to surround the conductive region CR so that no grease extraction grooves are located between the upper surface 3a of the semiconductor chip 3 and the portion of the radiating surface 5a of the radiating metal plate 5, which is opposite to the upper surface 3a thereof, making it possible to keep the heat conductivity between the semiconductor chip 3 and the heat sink 11 through the radiating surface 5a of the radiating metal plate 5 irrespective of the existences of first grease extrusion grooves 15.

Furthermore, it is possible to arrange the mold package 4 so as to surround the semiconductor chip 3 independent of the arrangement of first grease extrusion grooves 15.

Incidentally, it is also be desirable that the grease extrusion groves 15 are formed as many as possible because these many first grease extrusion grooves 15 allow the extrusion ability of excess grease member. It is preferable, however, to determine the number and each size of the first grease extrusion grooves 15 based on the balance between the degree of improvement of grease extrusion ability and that of decrease of the heat conductivity between the radiating surface 5a of the radiating metal plate 5 and the heat absorption area AR of the heat sink 11.

The grease extrusion grooves 15 may be formed concavely on the heat absorption area AR of the bottom surface 11a of the heat sink 11 in place of or in addition to the radiating surface 5a of the radiating metal plate 5.

If the insulating film is interposed between the radiating surface 5a and the heat absorption area AR of the bottom surface 11a, it is desirable that the grease extrusion grooves 15 are concavely formed on both of the heat absorption area AR of the bottom surface 11a and the radiating surface 5a because the grease member is applied on each of the heat absorption area AR and the radiating surface 5a.

In this modification, as similar to the first embodiment, it is possible to apply sufficient grease member on both of the radiating surface 5a of the radiating metal plate 5 and the heat absorption area AR of the heat sink 11 without the possibility that the excess grease member remains between the center portions of the radiating surface 5a of the radiating metal plate 5 and the heat absorption area AR of the heat sink 11.

In addition, after applying sufficiently the grease member on both of the radiating surface 5a of the radiating metal plate 5 and the heat absorption area AR of the heat sink 11, the first grease extrusion grooves 15 allow the excess grease member to be extruded from the semiconductor module 2 immediately without applying strong pressure to the semiconductor module 2 in a long time, making it possible to improve the radiating ability of the semiconductor module 2 of the semiconductor device 1 according to the above modification.

As semiconductor device 1A according to another modification, the grease member may be applied on both of the radiating surface 5a of the radiating metal plate 5 and the heat absorption area AR of the heat sink 11.

Figure 5:
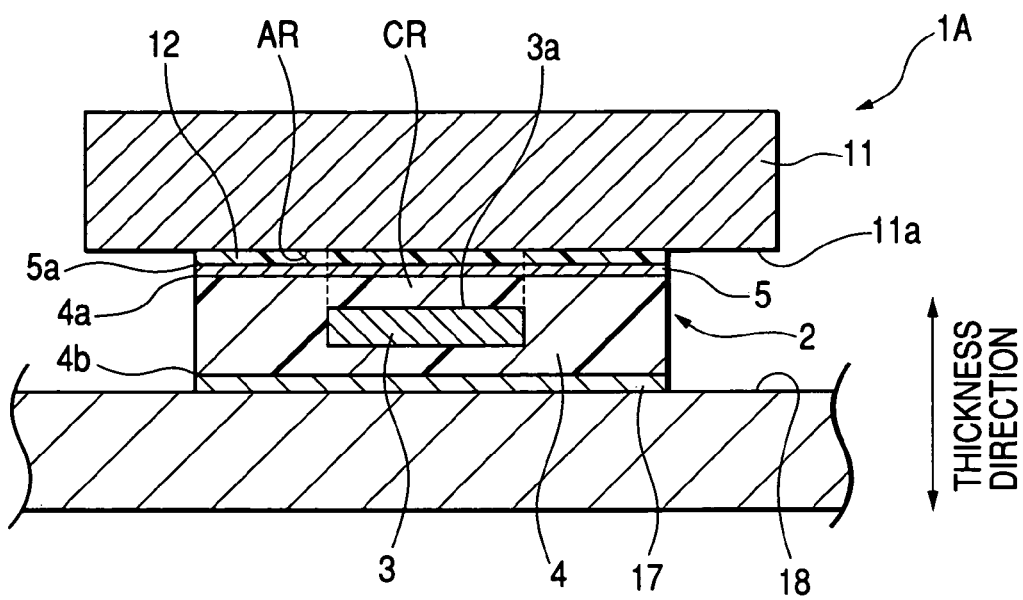
FIG. 5 is a cross sectional view of a semiconductor device according to a further modification of the first embodiment.

In further modification of this first embodiment, as shown in FIG. 5, the insulating film 17 may be interposed between the radiating surface 5a and the heat absorption area AR of the bottom surface 11a, and a radiating metal plate 18 may be formed on the bottom surface 4b of the mold package 4 in place of the wiring substrate 10.

In further modification, it is possible to cool the semiconductor module 2 from both of the top side and bottom side thereof.

As to further modification, one of the heat sink 11 and radiating metal plate 18 can be omitted.

In addition, in the first embodiment, each of the first grease extrusion grooves 15 straightly extends to the peripheral portion 5b of the radiating metal plate 5 so as to communicate with the exterior of the semiconductor module 2, but the present invention is not limited to the structure.

That is, at least one of the first grease extrusion grooves 15 may extend to be curved to the peripheral portion 5b of the radiating metal plate 5 so as to communicate with the exterior of the semiconductor module 2. Moreover, each of the first grease extrusion grooves 15 may branch at its downstream end portion in plurality of directions, and the branched grooves 15c are communicated with the exterior of the semiconductor module 2, respectively.

(Second Embodiment)

Figure 6:
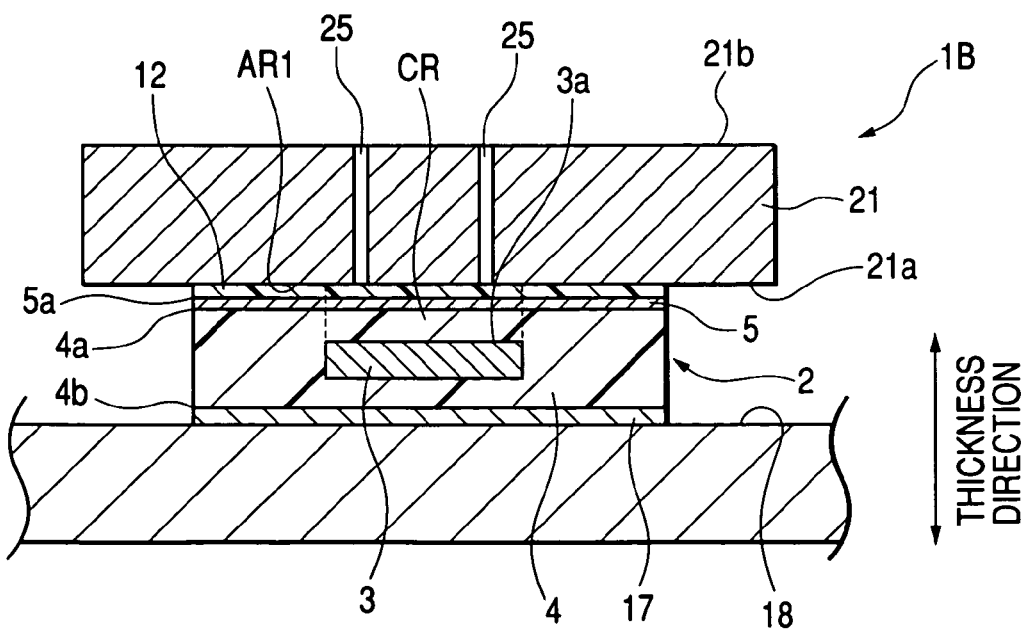
FIG. 6 is a cross sectional view of a semiconductor device according to a second embodiment of the invention, which corresponds to FIG. 1 of the first embodiment.
Figure 7:
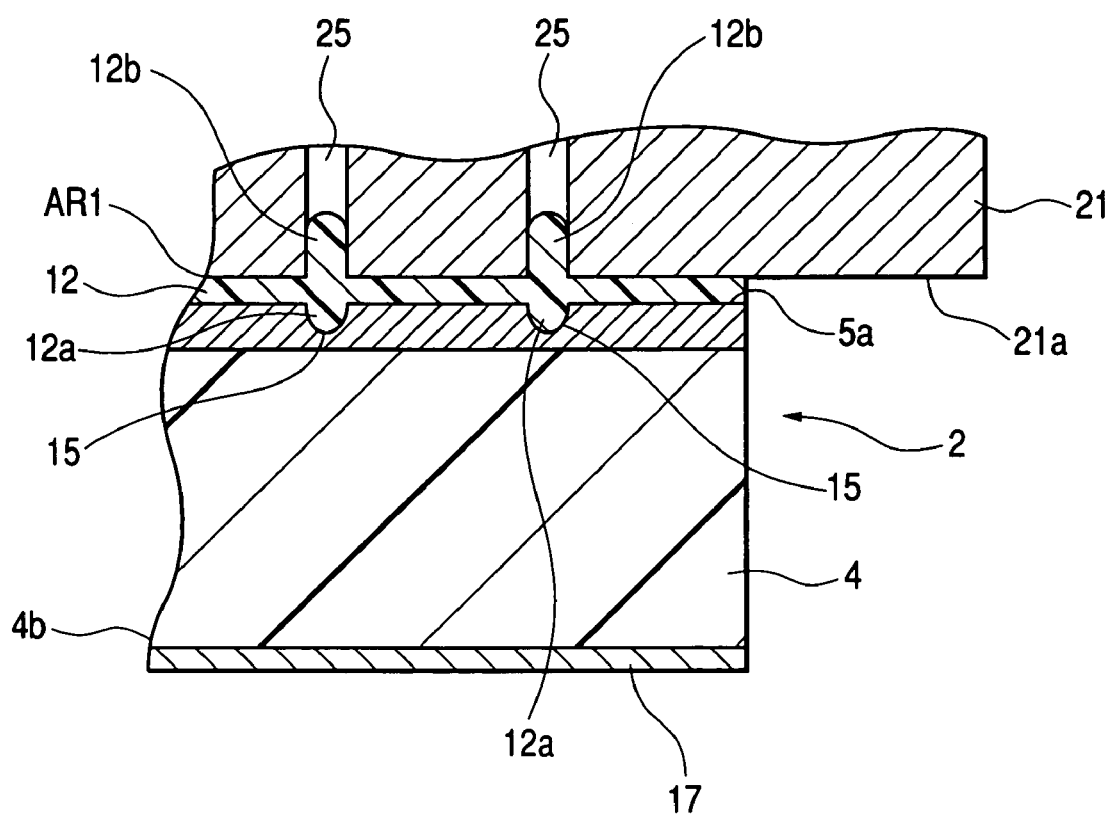
FIG. 7 is an enlarged cross sectional view mainly showing a heat sink of the semiconductor device shown in FIG. 6.

FIG. 6 is a cross sectional view of a semiconductor device according to a second embodiment of the invention, which corresponds to FIG. 1 of the first embodiment, and FIG. 7 is an enlarged cross sectional view mainly showing a heat sink of the semiconductor device shown in FIG. 6.

The semiconductor device 1B according to the second embodiment comprises the semiconductor module 2, the insulating film 17, and the radiating metal plate 18, which are shown in FIG. 5 and already explained hereinbefore.

In addition, the semiconductor device 1B also comprises a heat sink 21 that is substantially identical to the heat sink 11. The heat sink 21 has a bottom surface 21a and a top surface 21b shown in FIG. 6, and a heat absorption area AR1 of the bottom surface 21a, which is opposite to the radiating surface 5a through the grease layer 12, is closely contacted to the radiating surface 5a through the grease layer 12. The heat absorption area AR1 is substantially identical to the heat absorption area AR of the heat sink 11.

Moreover, the heat sink 21 is provided with a plurality of grease extrusion holes 25 that are penetrated therethrough in parallel to the thickness direction, respectively. Each of the grease extrusion holes 25 extends from the heat absorption area AR1 to the top surface 21b of the heat sink 21 so as to communicate with the exterior of the heat sink 21.

As shown in FIG. 7, it is preferable that the grease extrusion holes 25 are opposite to the first grease extrusion grooves 15 to be communicated through the grease layer 12.

In this second embodiment, it is also desirable that each of the first grease extrusion holes 25 has a predetermined diameter that approximately equals to the depth and/or the width of each first grease extrusion grooves 15.

Other elements are substantially identical to those of the semiconductor device 1 shown in FIGS. 1 to 5 so that explanations of other elements are omitted.

According to the semiconductor device 1B according to the second embodiment, the application of pressure to the sandwiched semiconductor module 2 by the heat sink 21 and the radiating metal plate 18 extrudes excess grease member located between the center portion of the radiating surface 5a and that of the heat absorption area AR outwardly through the periphery of the center portions.

At that time, in this second embodiment, the grease extrusion holes 25 are penetrated through the heat sink 21 to extend from the heat absorption area AR1 to the top surface 21b of the heat sink 21 in addition to the first grease extrusion grooves 15 so that the outwardly extruded excess grease member is divided to be introduced into the grease extrusion holes 25 and the first grease extrusion grooves 15, respectively, as shown in FIGS. 4 and 7.

Because each of the grease extrusion holes 25 extends to the top surface 21b of the heat sink 21 to communicate with the exterior thereof, the introduced excess grease members 12b in the grease extrusion holes 25 extruded from the region between the heat absorption area AR1 and the radiating surface 5a of the radiating substrate 5 through the corresponding grease extraction holes 25 toward the exterior of the heat sink 21, respectively, in addition to the extrusion of the excess grease members 12a through the first grease extrusion grooves 15.

Accordingly, it is possible to apply sufficient grease member on the at least one of the radiating surface 5a of the radiating metal plate 5 and the heat absorption area AR1 of the heat sink 21 without the possibility that the excess grease member remains between the center portions of the radiating surface 5a of the radiating metal plate 5 and the heat absorption area AR1 of the heat sink 21.

After applying sufficiently the grease member on the at least one of the radiating surface 5a of the radiating metal plate 5 and the heat absorption area AR1 of the heat sink 21, the grease extrusion members 25 also allow the excess grease member to be driven out from the heat sink 21 immediately without applying strong pressure to the semiconductor module 2 in a long time, making it possible to improve the radiating ability of the semiconductor module 2 of the semiconductor device 1B.

Incidentally, in this second embodiment, the first grease extrusion grooves 15 and the grease extrusion holes 25 are provided for the semiconductor device 1B, but only the grease extrusion holes 25 may be provided therefore.

As modification of the second embodiment, the lateral sectional area of the grease extrusion holes 25 orthogonal to the axial direction thereof is gradually or continuously increased as the position of the lateral sectional area separates from the radiating surface 5a.

This structure allows the releasing ability of excess grease member through the grease extrusion holes 25 to improve.

(Third Embodiment)

Figure 8:
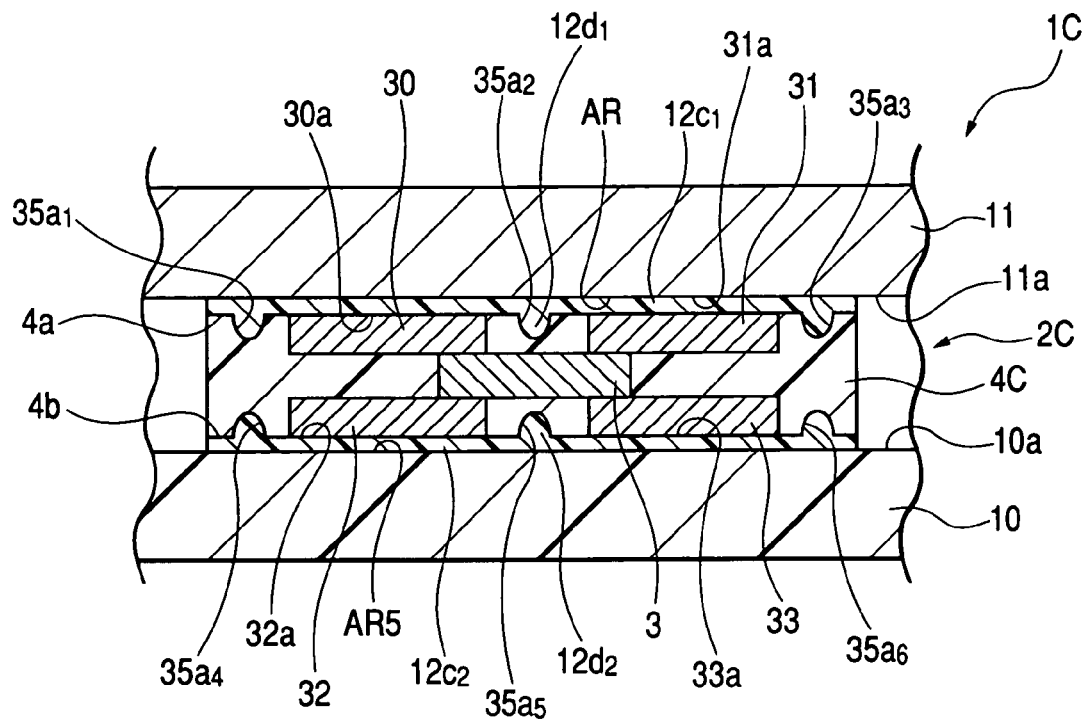
FIG. 8 is a cross sectional view of a semiconductor device according to a third embodiment of the invention, which corresponds to FIG. 1 of the first embodiment.

FIG. 8 is a cross sectional view of a semiconductor device according to a third embodiment of the invention, which corresponds to FIG. 1 of the first embodiment.

In the semiconductor device 1C according to the third embodiment, plate-like radiating metal plates 30, 31 are disposed in a top portion of the mold package 4C so that the radiating metal plates 30, 31 are separated from each other and exposed over the top surface 4a thereof.

In addition, plate-like radiating metal plates 32, 33 are disposed in a bottom portion of the mold package 4C so that the radiating metal plates 33, 33 are separated from each other and exposed over the bottom surface 4b thereof.

Each of the exposed surfaces 30a, 31a of each of the radiating metal plates 30, 31 is made flush with the top surface 4a of the mold package 4C, and each of the exposed surfaces 32a, 33a of each of the radiating metal plates 32, 33 is made flush with the bottom surface 4b thereof so that each top surface of each radiating metal plate is served as a radiating surface.

Other surfaces opposite to the exposed surfaces 30a, 31a of the radiating metal plates 30, 31 are contacted to the top surface 3a of the semiconductor chip 3, and other surfaces opposite to the exposed surfaces 32a, 33a of the radiating metal plates 32, 33 are contacted to a bottom surface 3b of the semiconductor chip 3 so that each of the radiating metal plates 30 to 33 is served as an electrode of the semiconductor chip 3.

Figure 9:
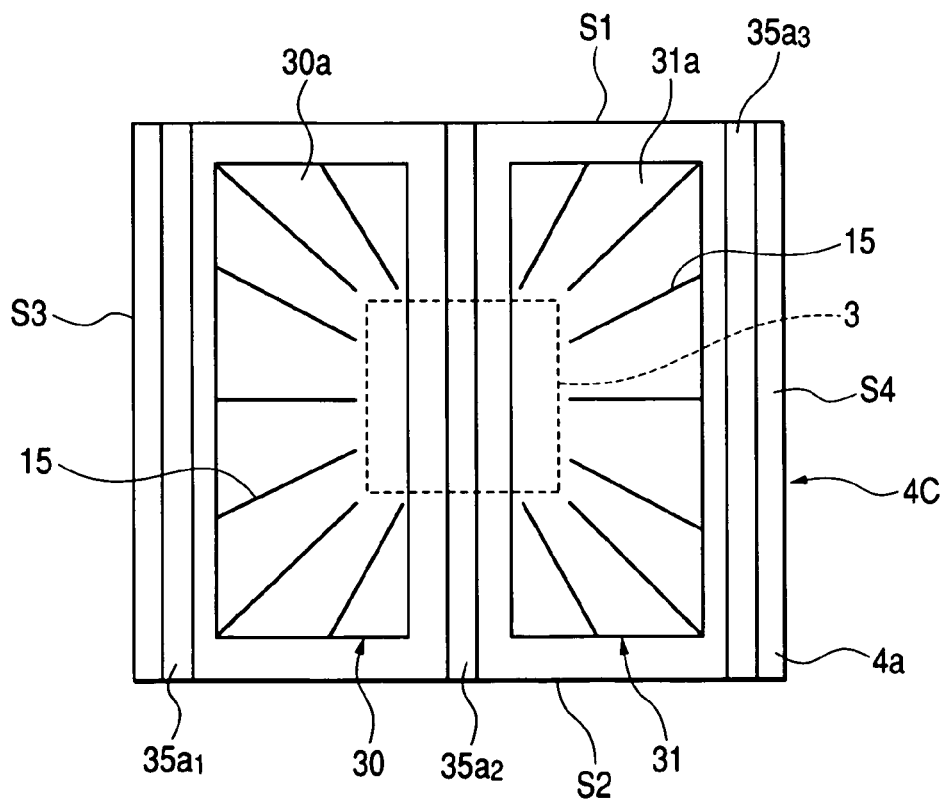
FIG. 9 is a plan view of a mold package of the semiconductor device shown in FIG. 8.

Similarly to the first embodiment, the semiconductor module 2C of the semiconductor device 1C comprises a plurality of grease extrusion grooves 15 concavely formed on the radiating surfaces (exposed surfaces) 30a, 31a, 32a, and 33a, respectively, which are shown in FIG. 9.

Furthermore, in this third embodiment, the semiconductor module 2C of the semiconductor device 1C comprises second grease extrusion grooves 35a1 to 35a3 concavely formed on the top surface 4a of the mold package 4, and third grease extrusion grooves 35a4 to 35a6 formed on the bottom surface 4b thereof.

As shown in FIG. 9, the second grease extrusion groove 35a2 is located over the semiconductor chip 3 and between the radiating metal plates 30 and 31 in parallel to the longitudinal direction of each of the plates 30 and 31. The second grease extrusion groove 35a2 extends from a peripheral side surface S1 of the module 4C to a peripheral side surface S2 thereof opposite to the peripheral side surface S1 to communicate with the exterior of the mold package 4C.

The second grease extrusion groove 35a1 is located close to a peripheral side surface S3 of the module 4C and in parallel to the second grease extrusion groove 35a2 so as to surround the radiating metal plate 30. Similarly, the second grease extrusion groove 35a3 is located close to a peripheral side surface S4 thereof, opposite to the peripheral side surface S3, and in parallel to the second grease extrusion groove 35a2 so as to surround the radiating metal plate 31.

Like the second grease extrusion grooves 35a1 to 35a3, the third grease extrusion groove 35a5 is located beneath the semiconductor chip 3 and between the radiating metal plates 32 and 33 in parallel to the longitudinal direction of each of the plates 32 and 33. The third grease extrusion groove 35a5 extends from the peripheral side surface S1 to the peripheral side surface S2 to communicate with the exterior of the mold package 4C.

The third grease extrusion groove 35a4 is located close to the peripheral side surface S3 and in parallel to the third grease extrusion groove 35a5 so as to surround the radiating metal plate 32. Similarly, the third grease extrusion groove 35a6 is located close to the peripheral side surface S4 and in parallel to the third grease extrusion groove 35a5 so as to surround the radiating metal plate 33.

It is preferable that the second and third grease extrusion grooves 35a1 to 35a6 may communicate with at least one of the first grease extrusion grooves 15, but they can be independent from the first grease extrusion grooves 15.

Moreover, a heat conductive grease layer 12c1 is mounted on the first radiating surface portion including the radiating surfaces 30a, 31a of the radiating metal substrate 30, 31 and the top surface 4a of the module 4 so that the heat sink 11 is mounted on the heat conductive grease layer 12c1, whereby the heat absorption area AR is closely contacted to the radiating surfaces 30a, 31a and the top surface 4a through the grease layer 12c1.

Similarly, a heat conductive grease layer 12c2 is interposed between a top surface 10a of the wiring substrate 10 and the second radiating surface portion including each of the radiating surfaces 32a, 33a of the radiating metal substrate 32, 33 and the bottom surface 4b of the module 4 so that a heat absorption area AR5 of the top surface 10a, which is opposite to the second radiating surface portion through the grease layer 12c2, is closely contacted to the second radiating surface portion through the grease layer 12c2.

Other elements are substantially identical to those of the semiconductor device 1 shown in FIGS. 1 to 5 so that explanations of other elements are omitted.

According to the semiconductor device 1C according to the third embodiment, the application of pressure to the sandwiched semiconductor module 2C by the heat sink 11 and the radiating metal plate 10 extrudes excess grease members located between the first radiating surface portion (the radiating surfaces 30a, 31a, and the top surface 4a) and the heat absorption area AR outwardly.

Simultaneously, the application of pressure to the sandwiched semiconductor module 2C also extrudes excess grease members located between the second radiating surface portion (the radiating surfaces 32a, 33a, and the bottom surface 4b) and the heat absorption area AR5 outwardly.

Then, in this third embodiment, the second grease extrusion grooves 35a1, 35a2, and 35a3 extend from the peripheral side surface S1 of the module 4C to the peripheral side surface S2 thereof to communicate with the exterior of the mold package 4C in addition to the first grease extrusion grooves 15 so that the outwardly extruded excess grease member 12d1 is divided to be introduced into the second grease extrusion grooves 35a1, 35a2, 35a3, and the first grease extrusion grooves 15, respectively, as shown in FIGS. 4 and 8.

Simultaneously, the third grease extrusion grooves 35a4, 35a5, and 35a6 extend from the peripheral side surface S1 of the module 4C to the peripheral side surface S2 thereof to communicate with the exterior of the mold package 4C in addition to the first grease extrusion grooves 15 so that the outwardly extruded excess grease member 12d2 is divided to be introduced into the third grease extrusion grooves 35a4, 35a5, 35a6, and the first grease extrusion grooves 15, respectively, as shown in FIGS. 4 and 8.

Therefore, it is possible to prevent the extruded excess grease members 12d1 from remaining in the region between the heat absorption area AR and the first radiating surface portion (radiating surfaces 30a, 31a, and top surface 4a), and, similarly, to prevent the extruded excess grease members 12d2 from remaining in the region between the heat absorption area AR5 and the second radiating surface portion (radiating surfaces 32a, 33a, and bottom surface 4b).

Particularly, even if the areas of the first and second radiating surface portions of the semiconductor module 2C are large, the top surface 4a is made flush with each of the radiating surfaces 30a, 31a, and the bottom surface 4b is made flush with each of the radiating surfaces 32a, 33a, each of the second and third grease extrusion grooves 35a1 to 35a6 can effectively prevent the excess grease members extruded from each of the first and second radiating surface portions and each of the heat absorption areas AR and AR5 from becoming stack therebetween.

As a result, it is possible to prevent the gap between semiconductor module 1C and each of the heat sink 11 and the wiring substrate 10 from increasing due to the excess grease members, allowing the radiating ability and heat conductivity between the semiconductor module and each of the heat sink 11 and the wiring substrate 10 to improve, respectively.

In addition, in this third embodiment, the second grease extrusion groove 35a2 can smoothly extrude therethrough the excess groove members drawn out from both of the radiating metal plates 30 and 31 toward oncoming directions, respectively.

(Fourth Embodiment)

Figure 10:
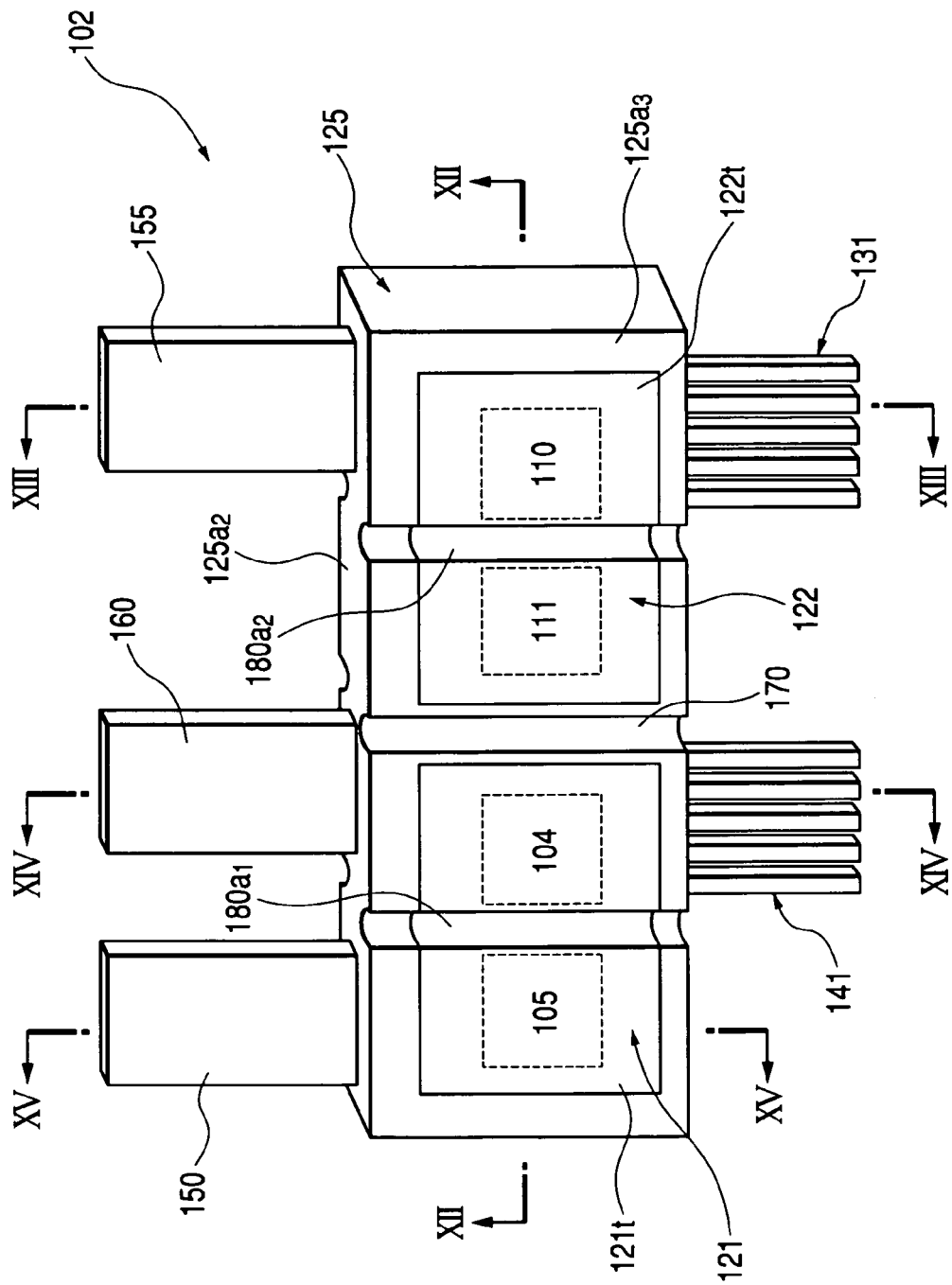
FIG. 10 is a perspective view illustrating a semiconductor module according to a fourth embodiment of the invention.
Figure 11:
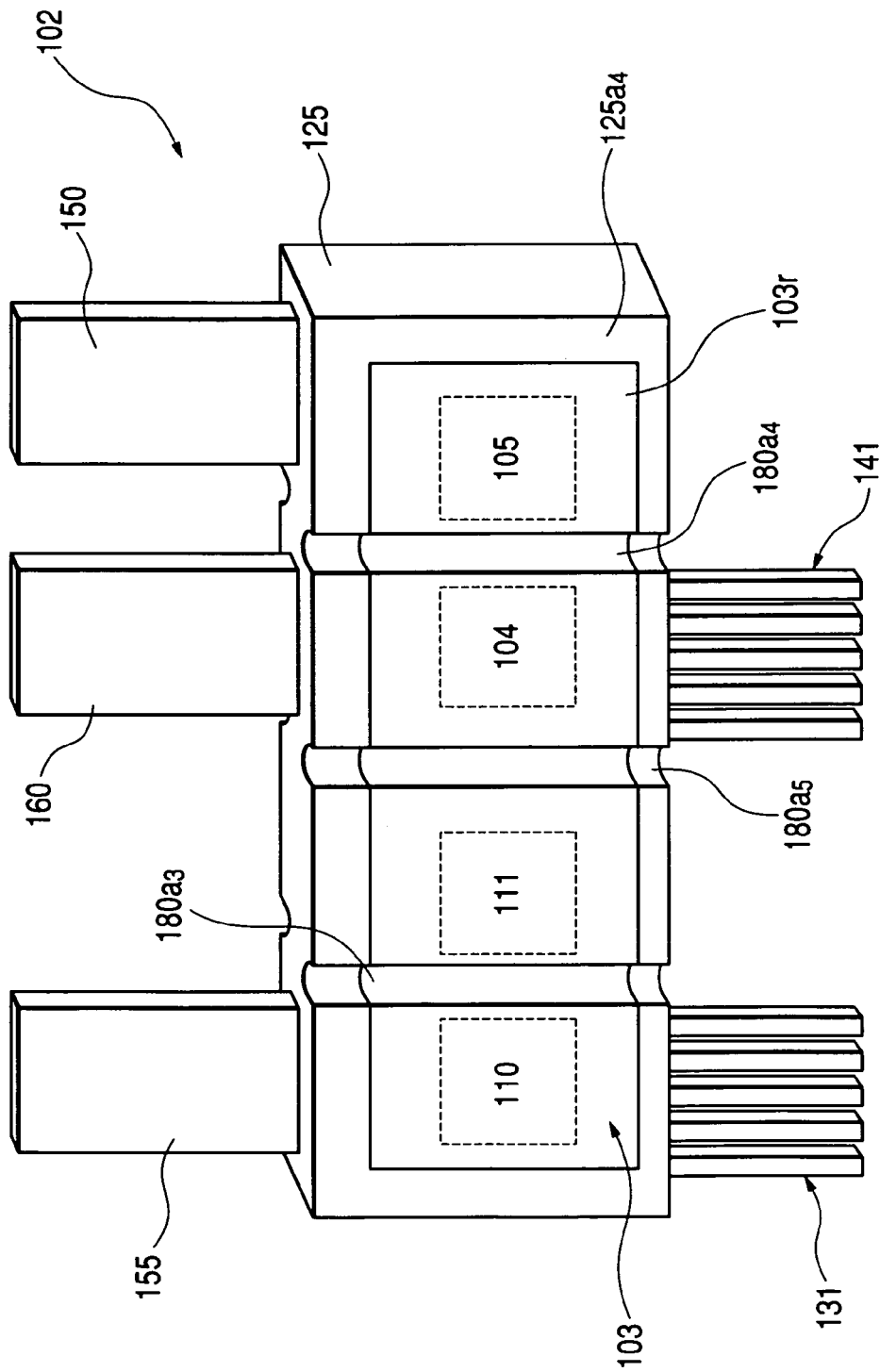
FIG. 11 is a perspective view illustrating a back side of the semiconductor module shown in FIG. 10.
Figure 12:
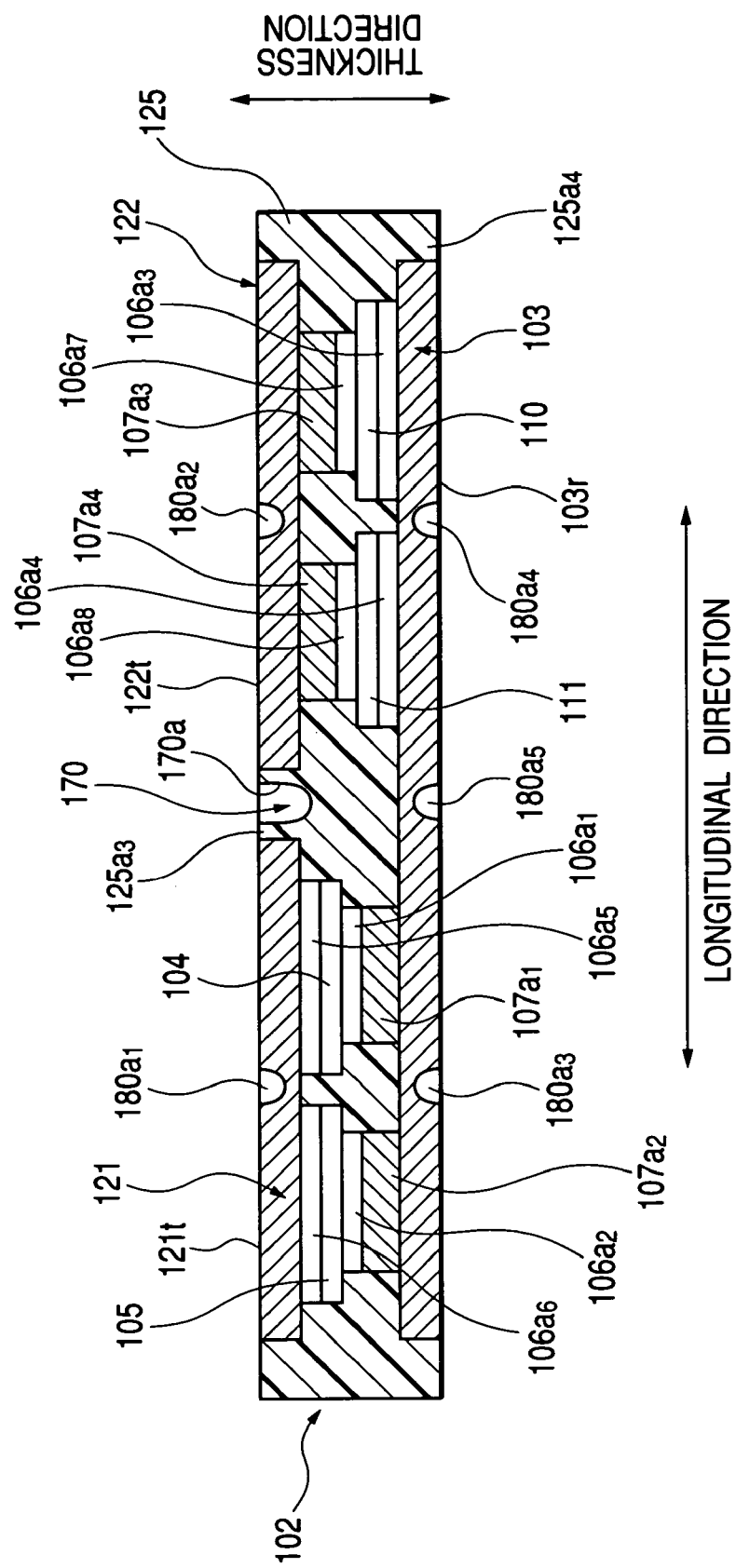
FIG. 12 is a cross sectional view taken on line XII—XII in FIG. 10.

FIG. 10 is a perspective view illustrating a semiconductor module according to a fourth embodiment of the invention, which contains a single-phase circuit of a three-phase inverter circuit, that is, a half-bridge circuit, FIG. 11 is a perspective view illustrating a back side of the semiconductor module shown in FIG. 10, and FIG. 12 is a cross sectional view taken on line XII—XII in FIG. 10.

Figure 13:
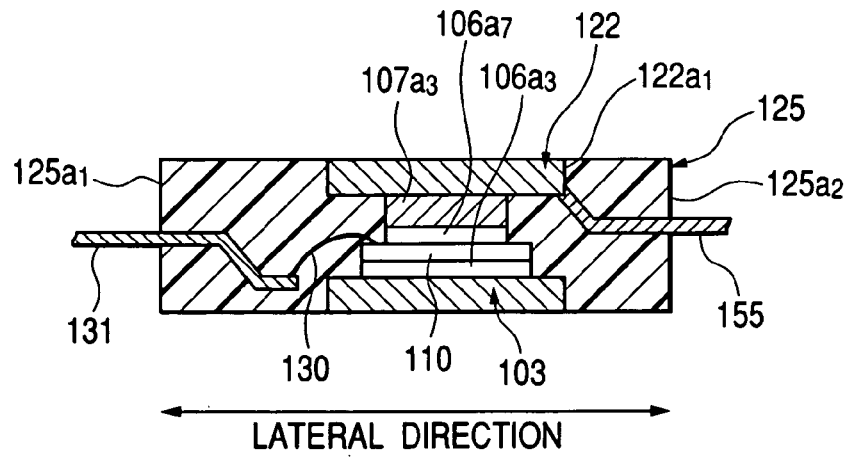
FIG. 13 is a cross sectional view taken on line XIII—XIII in FIG. 10.
Figure 14:
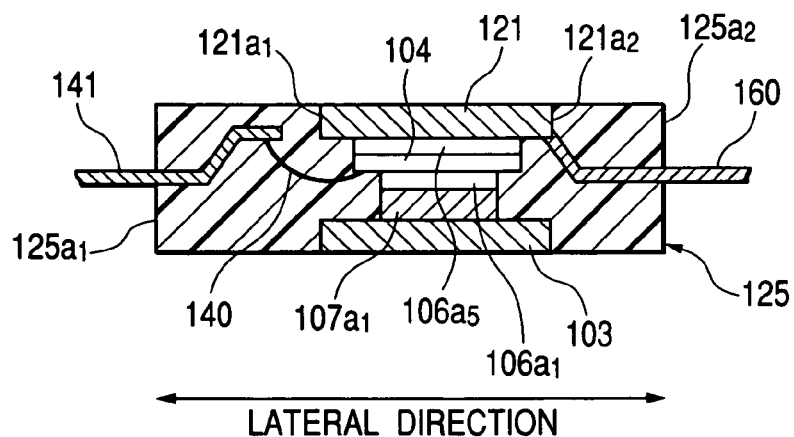
FIG. 14 is a cross sectional view taken on line XIV—XIV in FIG. 10.
Figure 15:
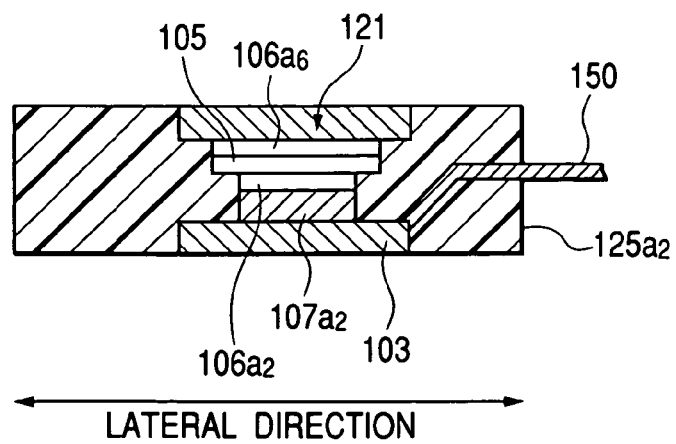
FIG. 15 is a cross sectional view taken on line XV—XV in FIG. 10.
Figure 16:
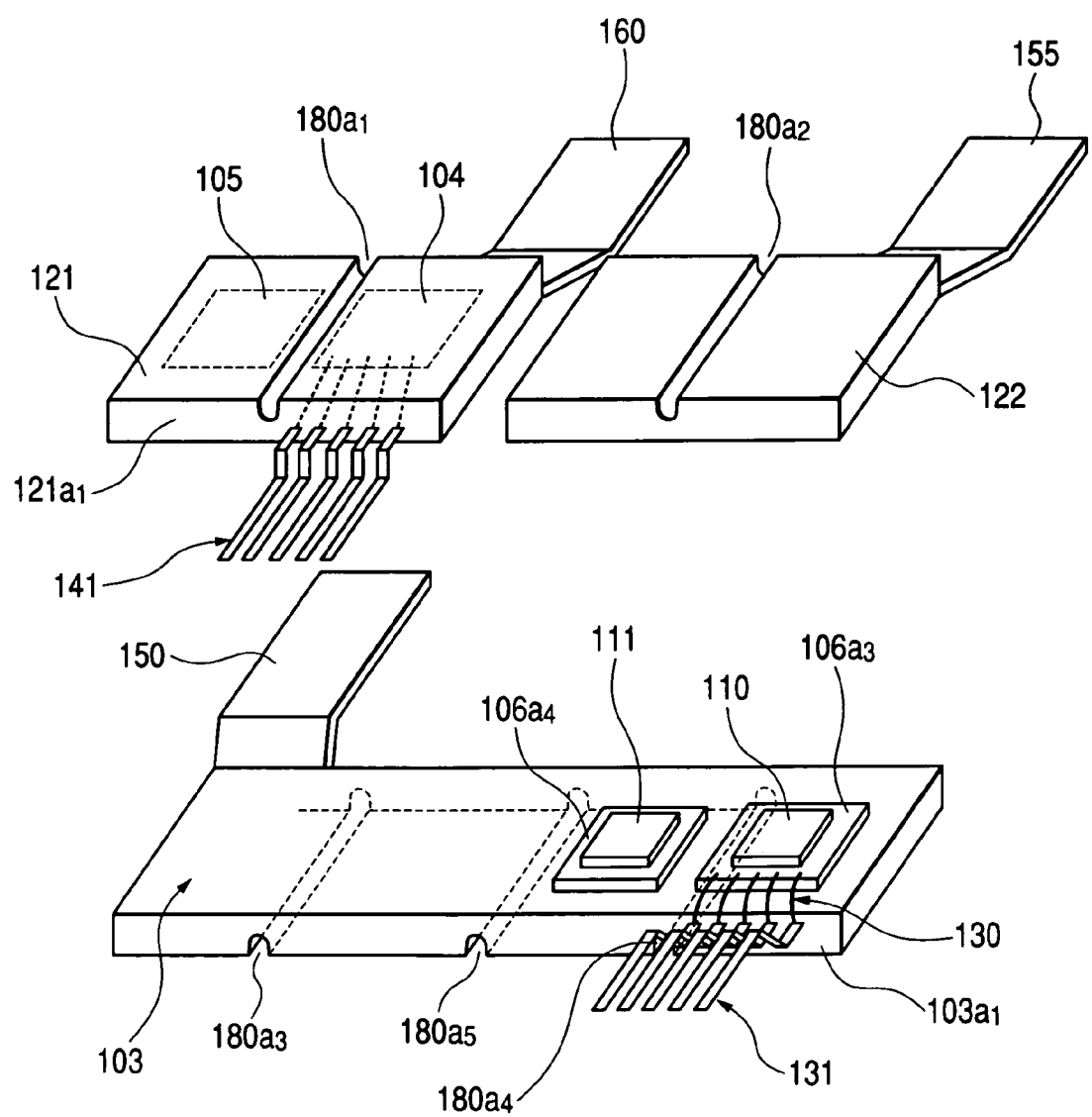
FIG. 16 is an exploded perspective view illustrating the semiconductor module shown in FIGS. 10 to 15.

In addition, FIG. 13 is a cross sectional view taken on line XIII—XIII in FIG. 10, FIG. 14 is a cross sectional view taken on line XIV—XIV in FIG. 10, FIG. 15 is a cross sectional view taken on line XV—XV in FIG. 10, FIG. 16 is an exploded perspective view illustrating the semiconductor module shown in FIGS. 10 to 15, and FIG. 17 is an equivalent circuit of the half-bridge circuit shown in FIG. 10.

Figure 19:
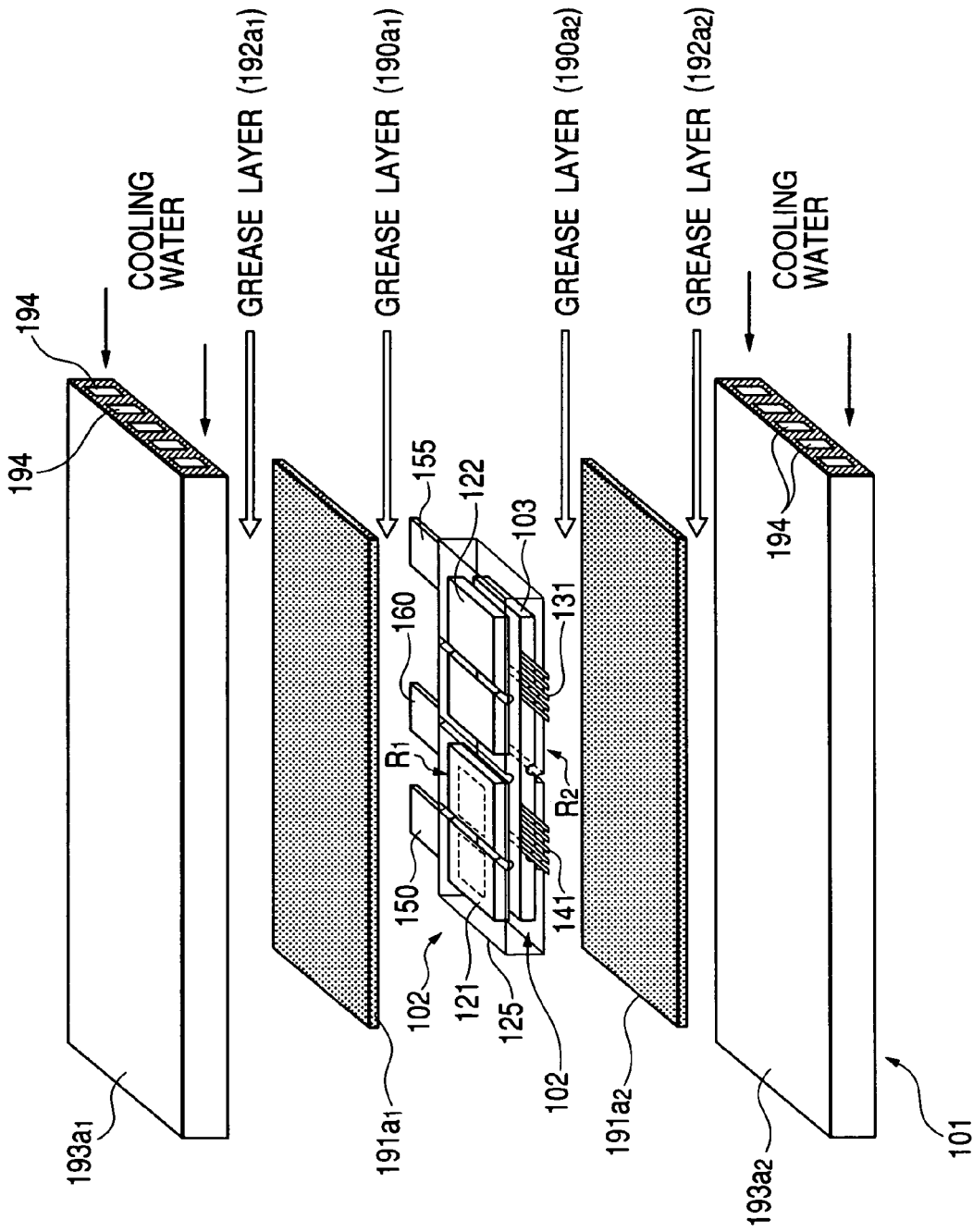
FIG. 19 is an exploded perspective view illustrating the semiconductor device shown in FIG. 18.

FIG. 18 is a cross sectional view illustrating a semiconductor device according to the fourth embodiment of the invention, which comprises the semiconductor module shown in FIGS. 10 to 17. FIG. 19 is an exploded perspective view illustrating the semiconductor device shown in FIG. 18.

The semiconductor device 101 according to the fourth embodiment comprises the semiconductor module 102.

The semiconductor module 102 comprises a thin plate-like middle-sided plate 103, a first high-sided semiconductor chip (a first upper arm chip of the single-phase circuit) 104 containing an IGBT (Insulated Gate Bipolar Transistor), and a second high-sided semiconductor chip (a second upper arm chip of the single-phase circuit) 105 containing a junction type diode.

The first and second high-sided chips 104 and 105 are mounted through solder layers 106a1 and 106a2 on copper spacers 107a1 and 107a2, respectively. The spacers 107a1 and 107a2 are fixedly mounted on one end portion (left end portion in FIG. 12) of the middle-sided plate 103 in a longitudinal direction thereof. The middle-sided plate 103 has heat and electric conductivity, and is served as an AC terminal of the single-phase circuit. The first and second high-sided chips 104 and 105 are adjacently arranged in the longitudinal direction of the middle-sided plate 103.

The semiconductor module 102 also comprises a first low-sided semiconductor chip (a first lower arm chip of the single-phase circuit) 110 containing an IGBT, and a second low-sided semiconductor chip (a second lower arm chip of the single-phase circuit) 111 containing a junction type diode.

The first and second low-sided chips 110 and 111 are fixedly mounted through solder layers 106a3 and 106a4 on other end portion (right end portion in FIG. 12) of the middle-sided plate 103 in the longitudinal direction, respectively.

The semiconductor module 102 also comprises a high-sided plate 121 having heat and electric conductivity and constituting a high-sided terminal of the three-phase inverter circuit. The high-sided plate 121 is arranged in parallel to the middle-sided plate 103 and fixedly mounted on the first and second high-sided chips 104 and 105 through the solder layers 106a5 and 106a6, respectively.

In addition, the semiconductor module 102 comprises a low-sided plate 122 having heat and electric conductivity and constituting a low-sided terminal of the three-phase inverter circuit. On the other hand, spacers 107a3 and 107a4 are fixedly mounted through solder layers 106a7 and 106a8 on the first and second low-sided chips 111 and 112, respectively.

The low-sided plate 122 is arranged in parallel to the middle-sided plate 103 and fixedly mounted on the spacers 107a3 and 107a4, respectively.

Each of the middle-sided plate 103, the high-sided plate 121, the low-sided plate 122, and the copper spacers 107 is composed of a metal flat plate made of such as tungsten, molybdenum, or may be made of a nickel copper pate.

The semiconductor module 2 further comprises a substantially flat plate-like mold package 125 containing the integrated combination including the plates 103, 121, 122, the solder layers 106, the spacers 107, and the chips 104 to 107 to cover both side surfaces of the first and second high-sided chips 104 and 105, and both side surfaces of the first and second low-sided chips 110 and 111. A bottom surface 103b of the middle-sided plate 103, a top surface 121t of the high-sided plate 121, and a top surface 122t of the low-sided plate 122 are exposed, respectively.

That is, in the semiconductor module 102, the second high-sided chip (diode chip) 105, the first high-sided chip (IGBT chip) 104, the second low-sided chip 111, and the first low-sided chip 110 are aligned in the longitudinal direction of the middle-sided plate 103.

As shown in FIG. 13, the spacer 107a3 is fixed on the low-sided plate 122 so as to be served as a part of the low-sided plate 122, and is soldered to the first low-sided chip 110.

The spacer 107a3 has a predetermined width in a lateral direction of the middle-sided plate 103, which is shorter than that of the first low-sided chip 110. A conductive pad (not shown) for low current mounted on an exposed top surface of the first low-sided chip 110 is electrically connected through bonding wires 130 to low current terminals 131.

Figure 17:
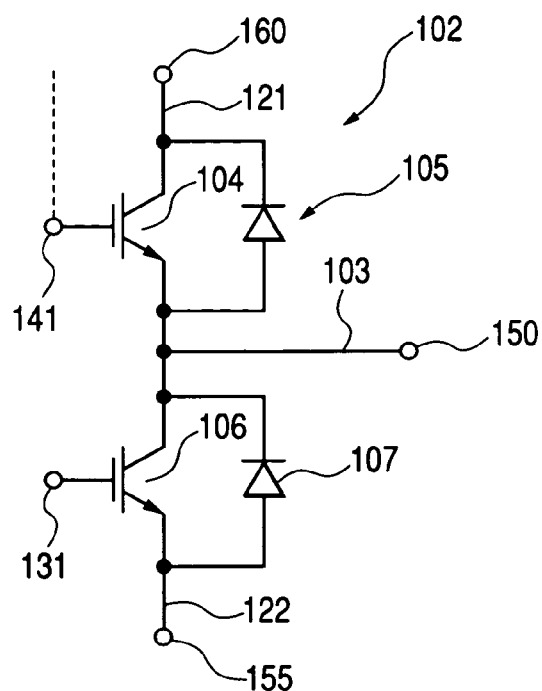
FIG. 17 is an equivalent circuit of a half-bridge circuit shown in FIG. 10.

The low current terminals 131 include a gate electrode terminal, shown in FIG. 17, and other sensing terminals, and are integrally formed with the middle-sided plate 103 based on lead frame technique to be cut out. The cutout low current terminals 131 extend from one side surface 103a1 of other end portion of the middle-sided plate 103 and fixed by the mold package 125 so as to project through one end of first side surface 125a1 of the mold package 125, which is opposite to the one side surface 103a1 of the middle-sided plate 103.

The mold package 125 covers the bonding wire 140 to protect it. The middle-sided plate 103 and the spacer 107a3 are electrically connected to a conductive pad (not shown) constituting a main electrode of the first low-sided chip 110. Similarly, the main electrode of the second low-sided chip 111 is configured as the same as that of the first low-sided chip 110.

As shown in FIG. 14, the spacer 107a1 is fixed on the middle-sided plate 103 so as to be served as a part of the middle-sided plate 103, and is soldered to the first high-sided chip 104.

The spacer 107a1 has a predetermined width in the lateral direction of the middle-sided plate 103, which is shorter than that of the first high-sided chip 104. A conductive pad (not shown) for low current mounted on an exposed bottom surface of the first high-sided chip 104 is electrically connected through bonding wires 140 to low current terminals 141. The low current terminals 141 include a gate electrode terminal, shown in FIG. 17, and other sensing terminals, and are integrally formed with the middle-sided plate 103 based on lead frame technique to be cut out. The cutout low current terminals 141 extend from one side surface 121a1 of the high-sided plate 121 and fixed by the mold package 125 so as to project through other end of the first side surface 125a1 of the mold package 125, which is opposite to the one side surface 121a1 of the high-sided plate 121.

The mold package 125 covers the bonding wire 130 to protect it. The high-sided plate 121 and the spacer 107a1 are electrically connected to a conductive pad (not shown) constituting a main electrode of the first high-sided chip 104. Similarly, the main electrode of the second high-sided chip 105 is configured as the same as that of the first high-sided chip 104.

In addition, as shown in FIG. 15, the spacer 107a2 is secured on the middle-sided plate 103 so as to be served as a part of the middle-sided plate 103, and is soldered to the second high-sided chip 105. The spacer 107a2 has a predetermined width in the lateral direction of the middle-sided plate 103, which is shorter than that of the second high-sided chip 105. A middle-sided terminal 150 extends from other side surface 121a2 of the high-sided plate 121 to project through the other end of second side surface 125a2 of the mold package 125, which is opposite to the first side surface 125a1 and other side surface 121a2 of the high-sided plate 121, which is opposite to the one side surface 121a1.

A low-sided terminal 155 extends from one side surface 122a1 of the low-sided plate 122 and projects through the one end of the second side surface 125a2 of the mold package 125, which is opposite to the one side surface 122a1 of the low-sided plate 122.

Furthermore, a high-sided terminal 160 extends from other side surface 121a2 of the high-sided plate 121 and fixed by the mold package 125 so as to project through the other end of the second side surface 125a2 of the mold package 125, which is opposite to the other side surface 121a2 of the high-sided plate 121.

Each width of each of the high-sided terminal 160, the low-sided terminal 155, and the middle-sided terminal 150 in the longitudinal direction is dramatically shorter than each of the lengths of side surface 121a2 of the high-sided plate 121, the side surface 122a2 of the low-sided plate 122 and the other side surface 103a2 of the middle-sided plate 103 in the longitudinal direction.

The low-sided terminal 155 extends from the one side surface 122a1 to be bent in the thickness direction toward the middle-sided plate side, and further extends in the lateral direction to project through a middle portion of the one end of the second side surface 125a2 of the mold package 125 in the thickness direction thereof.

The high-sided terminal 160 extends from the other side surface 121a2 to be bent in the thickness direction toward the middle-sided plate side, and further extends in the lateral direction to project through a middle portion of the other end of the second side surface 125a2 of the mold package 125 in the thickness direction thereof.

The middle-sided terminal 150 extends from the other side surface 103a2 to be bent in the thickness direction toward the low-sided plate side, and further extends in the lateral direction to project through a middle portion of the one end of the second side surface 125a2 of the mold package 125 in the thickness direction thereof.

Furthermore, the semiconductor module 102 according to the fourth embodiment comprises a third grease extrusion groove 170 concavely formed on a portion of a third side surface 125a3 of the mold package 125 that is flush with the top surfaces 121t and 122t of the high-sided and low-sided plates 121 and 122 in the longitudinal direction, portion which is located between the high-sided plate 121 and the low-sided plate 122. Incidentally, the exposed top surfaces 121t and 122t, and the third side surface 125a3 of the mold package 125 consist of a first radiating surface R1 of the semiconductor module 101.

The third grease extrusion groove 170 is arranged in parallel to the lateral direction and extends from the first side surface 125a1 of the mold package 125 to the second side surface 125a2 thereof to communicate with the exterior of the mold package 125.

In addition, the semiconductor module 102 according to the fourth embodiment comprises fourth grease extrusion grooves 180a1 to 180a5.

The fourth grease extrusion groove 180a1 is concavely formed on a middle portion of the top surface 121t of the high-sided plate 121 and a portion of the third side surface 125a3 of the mold package 125, middle portion which is located between the first and second high-sided chips 104 and 105 in the longitudinal direction, portion which is aligned to the middle portion in the lateral direction.

The fourth grease extrusion groove 180a1 extends toward the first side surface 125a1 of the mold package 125 and the second side surface 125a2 thereof to communicate with the exterior of the mold package 125.

The fourth grease extrusion groove 180a2 is concavely formed on a middle portion of the top surface 122t of the low-sided plate 122 and a portion of the third side surface 125a3 of the mold package 125, middle portion which is located between the first and second low-sided chips 110 and 111 in the longitudinal direction, portion which is aligned to the middle portion in the lateral direction.

The fourth grease extrusion groove 180a2 extends toward the first side surface 125a1 of the mold package 125 and the second side surface 125a2 thereof to communicate with the exterior of the mold package 125.

The fourth grease extrusion groove 180a3 is concavely formed on one end portion of the bottom surface 103b of the middle-sided plate 103, which is opposite to the fourth grease extrusion groove 180a1, and a portion of the fourth side surface 125a4 of the mold package 125, which is aligned to the one end portion of bottom surface 103b in the lateral direction.

The fourth grease extrusion groove 180a3 extends toward the first side surface 125a1 of the mold package 125 and the second side surface 125a2 thereof to communicate with the exterior of the mold package 125.

The fourth grease extrusion groove 180a4 is concavely formed on other end portion of the bottom surface 103b of the middle-sided plate 103, which is opposite to the fourth grease extrusion groove 180a2, and a portion of the fourth side surface 125a4 of the mold package 125, which is aligned to the other end portion of bottom surface 103b in the lateral direction.

The fourth grease extrusion groove 180a4 extends toward the first side surface 125a1 of the mold package 125 and the second side surface 125a2 thereof to communicate with the exterior of the mold package 125.

The fourth grease extrusion groove 180a5 is concavely formed on a portion of a fourth side surface 125a4 of the mold package 125 that is flush with the bottom surface 103b of the middle-sided plate 103 in the longitudinal direction, portion which is located in opposite to the third extrusion groove 170. Incidentally, the exposed bottom surface 103b and the fourth side surface 125a4 of the mold package 125 consist of a second radiating surface R2 of the semiconductor module 101.

The fourth grease extrusion groove 180a5 is arranged in parallel to the lateral direction and extends from the first side surface 125a1 of the mold package 125 to the second side surface 125a2 thereof to communicate with the exterior of the mold package 125.

The third grease extrusion groove 170 has a predetermined depth that is longer than that of each of the fourth grease extrusion grooves 180a1 to 180a5 so that the third grease extrusion groove 170 has a concavely curved inner surface whose distance in the curved direction is long.

Furthermore, the semiconductor device 101 according to the fourth embodiment is designed to use the semiconductor module 102 shown in FIGS. 10 to 17.

In addition, as shown in FIGS. 18 and 19, the semiconductor device 101 further comprises a pair of first and second thin plate-like heat conductive grease layers 190a1, 190a2 that are formed to closely contact on the first radiating surface R1 and the second radiating surface R2 of the semiconductor module 101, respectively.

The semiconductor device 101 comprises a pair of first and second insulating films 191a1, 191a2 that are formed to closely contact on the first and second grease layers 190a1, 190a2, respectively.

The semiconductor device 101 also comprises a pair of thin plate-like third and fourth heat conductive grease layers 192a1, 192a2 that are formed to closely contact on the first and second insulating films 191a1, 191a2, respectively.

Each of the grease layers 190 to 192 is made of a grease member with heat conductivity, similarly to the first embodiment.

The semiconductor device 101 further comprises a pair of first and second cooling plates 193a1, 193a2 that are made of rectangular parallelepiped aluminum or copper block and that are formed to closely contact on the third and fourth grease layers 192a1, 192a2, respectively.

Each of the first and second cooling plates 193a1, 193a2 comprises a plurality of cooling paths 194 penetrated in the longitudinal direction. The cooling paths 194 are arranged in parallel to the longitudinal direction at regular intervals in each of the first and second cooling plates 193a1, 193a2 so that cooling water is supplied to be circulated in each of the cooling paths 194.

Figure 20:
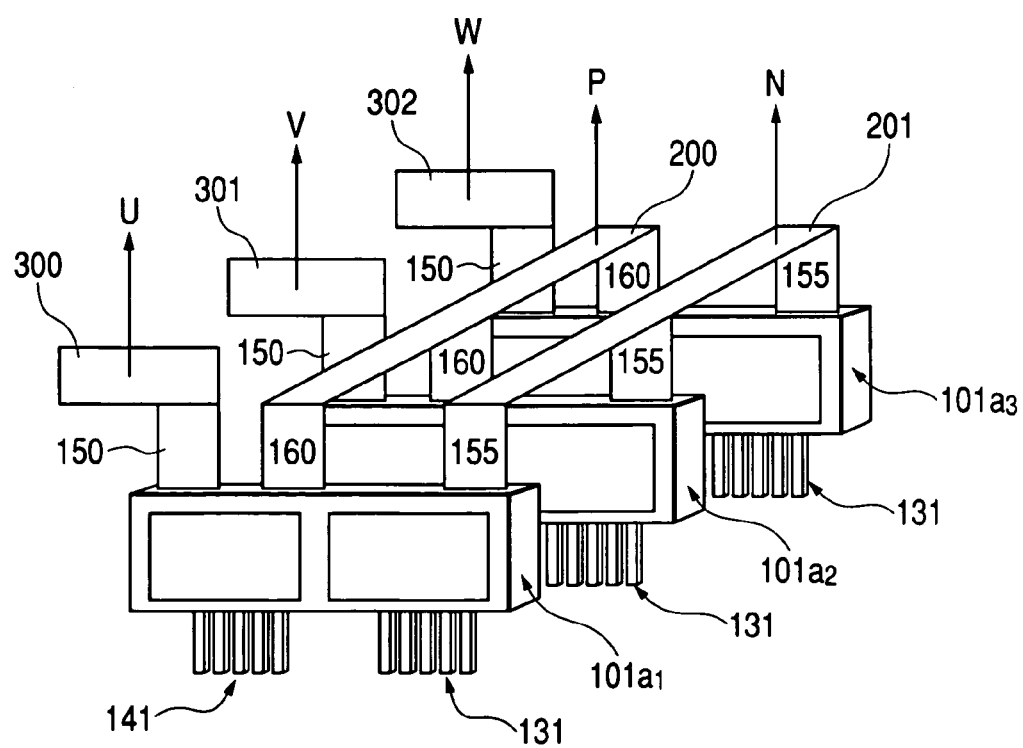
FIG. 20 is a perspective view showing a three-phase inverter circuit composed of three semiconductor devices each of which corresponds to the half-bridge circuit and has the same structure of the semiconductor device shown in FIG. 18.

On the other hand, FIG. 20 is a perspective view showing the three-phase inverter circuit composed of three semiconductor devices 101a1 to 101a3 each of which corresponds to the half-bridge circuit and has the same structure of the semiconductor device 101.

The semiconductor device 101a1 corresponding to a U-phase half-bridge circuit, the semiconductor device 101a2 corresponding to a V-phase half-bridge circuit, and the semiconductor device 101a3 corresponding to a W-phase half-bridge circuit are arranged in parallel to each other so that the plates 103, 121 and 122 of the respective devices 101a1, 101a2, and 101a3 are parallel to each other.

In FIG. 20, the low current terminals 131 and 141 are arranged to project downwardly with respect to the semiconductor module 102, and the high-sided, low-sided and middle-sided terminals 160, 155, and 150, that is, direct current terminals 160, 155, and 150 are arranged to project upwardly with respect thereto.

The high-sided terminals 160 of the devices 101a1, 101a2, and 101a3 are electrically connected through a busbar 200 to a high-sided current terminal of a battery, which are not shown.

The low-sided terminals 155 of the devices 101a1, 101a2, and 101a3 are electrically connected through a busbar 201 to a low-sided current terminal of the battery.

The middle-sided terminals 150 of the devices 101a1, 101a2, and 101a3 are electrically connected to busbars 300, 301, and 302 which correspond to output wires of a load, such as motor. In FIG. 20, the busbars 300 to 302 are arranged to be orthogonal to each of the busbars 200 and 201.

Next, the overall operations of the semiconductor device 101 will be described hereinafter.

In this fourth embodiment, as shown in FIG. 19, in order to assemble the semiconductor device 101, a grease member is applied on a top surface of the second cooling plate 193a2 so that the second insulating film 191a2 is mounted to be closely contacted on the surface of the second cooling plate 193a2 through the grease member.

Next, a grease member is applied on at least one of a top surface of the insulating film 191a2 and the second radiating surface R2 of the semiconductor module 102 so that the semiconductor module 102 is mounted to be closely contacted on the insulating film 191a2 through the grease member.

A grease member is applied on at least one of the first radiating surface R1 of the semiconductor module 102 and a bottom surface of the first insulating film 191a1 so that the first insulating film 191a1 is mounted to be closely contacted to the semiconductor module 102 through the grease member.

Then, a grease member is applied on a top surface of the first insulating film 191a1 and a bottom surface of the first cooling plate 193a1 so that the first cooling plate 193a1 is mounted to be closely contacted on the top surface of the first insulating film 191a1 through the grease member.

When the laminated structure of the semiconductor module 102, the insulating films 191 and the cooling plates 193 is formed, the semiconductor module 102 is sandwiched between the first and second cooling plates 193a1 and 193a2 at a predetermined pressure so that the first grease layer 190a1 with a preferably predetermined thin thickness can be formed between the semiconductor module 102 (the first radiating surface R1) and the first insulating film 191a1, and the second grease layer 190a2 with a preferably predetermined thin thickness can be formed between the semiconductor module 102 (the second radiating surface R2) and the second insulating film 191a2.

According to the semiconductor device 101 according to the fourth embodiment, the application of pressure to the sandwiched semiconductor module 102 between the first and second cooling plates 193a1 and 193a2 extrudes excess grease members located between the first radiating surface R1 and the first insulating film 191a1, and between the second radiating surface R2 and the second insulating film 191a2.

Then, in this fourth embodiment, the third grease extrusion groove 170, and the fourth grease extrusion grooves 180a1, 180a2 are formed on the first radiating surface R1 of the semiconductor module 102 so as to extend toward the first side surface 125a1 of the mold package 125 and the second side surface 125a2 thereof to communicate with the exterior of the mold package 125, so that the outwardly extruded excess grease member GM1 is divided to be introduced into the third grease extrusion groove 170, and the fourth grease extrusion grooves 180a1, 180a2, respectively, as shown in FIG. 18.

Simultaneously, the fourth grease extrusion grooves 180a3 to 180a5 are formed on the second radiating surface R2 of the semiconductor module 102 so as to extend toward the first side surface 125a1 of the mold package 125 and the second side surface 125a2 thereof to communicate with the exterior of the mold package 125, so that the outwardly extruded excess grease member GM2 is divided to be introduced into the fourth grease extrusion grooves 180a3 to 180a5, respectively, as shown in FIG. 18.

Figure 21:
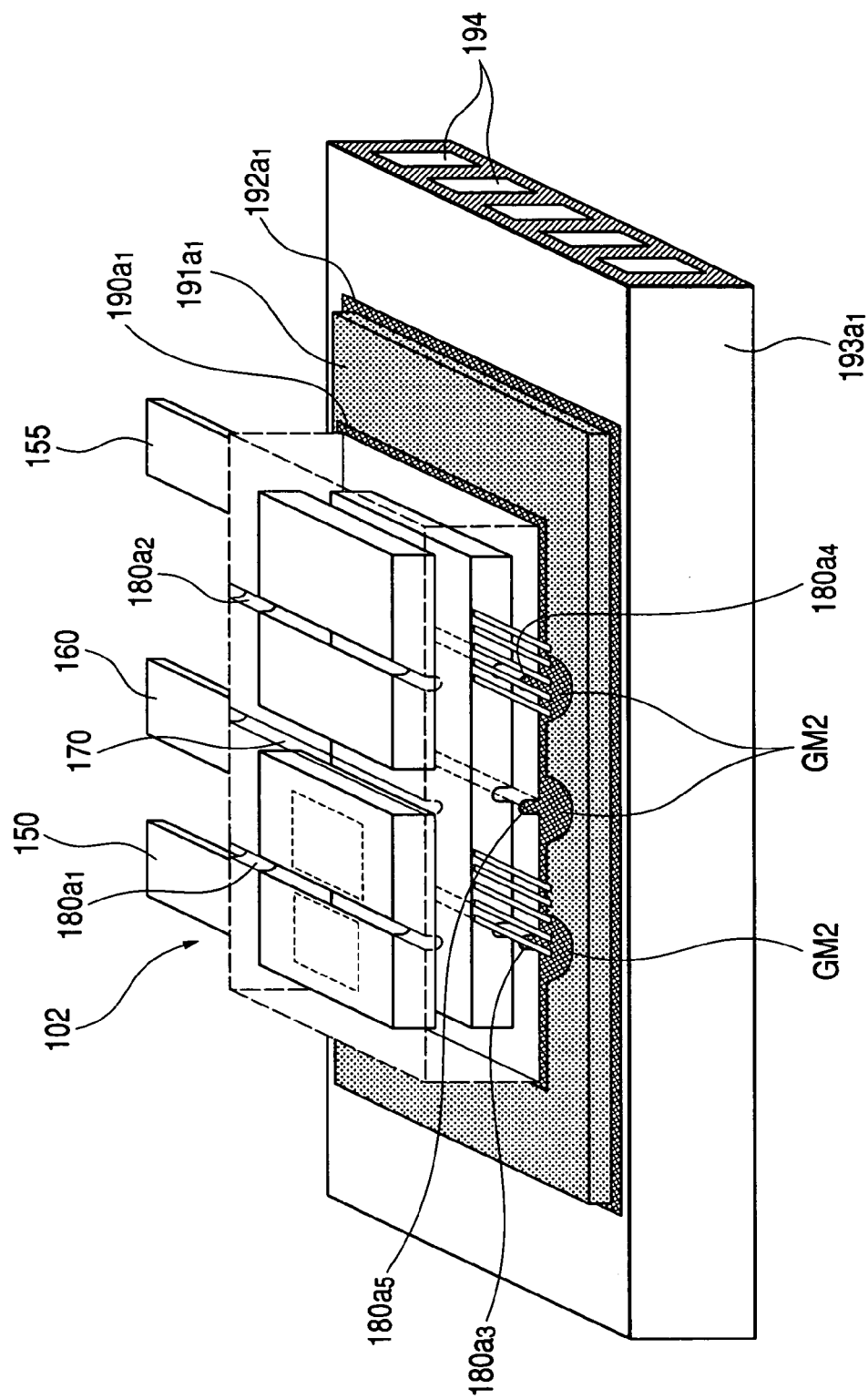
FIG. 21 is a perspective view illustrating the semiconductor device shown in FIG. 18, and a state that excess grease member is extruded from the semiconductor module according to the fourth embodiment.

As a result, the excess grease members GM1 and GM2 introduced into the third and fourth grease extrusion grooves 170 and 80a1 to 180a5 are smoothly extruded therethrough to the exterior of the semiconductor module 102 in a short period of time, as shown in FIG. 21.

Therefore, it is possible to prevent the extruded excess grease members GM1 from remaining in the region between the first radiating surface R1 of the semiconductor module 101 and the first insulating film 191a1, and, similarly, to prevent the extruded excess grease members QM2 from remaining in the region between the second radiating surface R2 of the semiconductor module 102 and the second insulating film 191a2.

In particular, the third grease extrusion groove 170 is located on the portion of the third side surface 125a3 of the mold package 125 between the high-sided plate 121 and the low-sided plate 122 so that it allows the creepage distance between the high-sided plate 121 and the low-sided plate 122 on the third side surface 125a3 to increase as compared with having no groove 170 therebetween.

The increase of the creepage distance between the high-sided plate 121 and the low-sided plate 122 can prevent the creepage discharge on the third side surface 125a3 therebetween from occurring so that it is possible to arrange the high-sided plate 121 and the low-sided plate 122 as close as possible, allowing the semiconductor module (device) to be compact.

In addition, in this fourth embodiment, it is possible to cool the semiconductor module 102 from both of the first radiating surface R1 and the second radiating surface R2 by the first and second cooling plates 193, allowing the cooling capability of the semiconductor device 101.

Moreover, as shown in FIGS. 10 to 12, the middle-sided terminal 150, the high-sided terminal 160, and the low-sided terminal 155 are disposed to the mold package 125 at predetermined intervals in the longitudinal direction to project through the second side surface 125a2 of the mold package 125 corresponding to the other side surface 103a2 of the middle-sided plate 103, second side surface 125a2 through which no low current terminals project, and the middle-sided terminal 150 is arranged to project through the one end of the second side surface 125a2 of the mold package 125.

That is, the middle-sided terminal 150 electrically connected to the output wires of the load, such as the motor, is not caught between the low-sided terminal 155 and the high-sided terminal 160 electrically connected to battery wires of the battery, allowing the output wires and the battery wires not to tangle with each other.

Therefore, as compared with the structure in which the middle-sided terminal, the high-sided terminal, and the low-sided terminal are arranged to project toward the same direction through the same surface of the semiconductor module, it is possible to simplify the wire laying works and the wire connection works with respect to the semiconductor device 101, and to reduce the spaces required for containing the output wires and the battery wires.

As compared with the structure in which the middle-sided terminal is arranged to project toward one direction through one surface of the semiconductor module, and the high-sided and low-sided terminals are arranged to project toward other direction through other surface thereof, other direction which is opposite to the one direction, other surface which is opposite to the one surface, it is possible to keep the sufficient interval between each of the low-current terminals 131, 141 and the middle-sided terminal 150.

As a result, it is possible to simplify the wire connection works with respect to the semiconductor device 101, and to prevent the creepage discharge between each of the low current terminals 131, 141 and the middle-sided plate 150.

The semiconductor device 101 according to the fourth embodiment can prevent the creepage discharge between the middle-sided terminal 150 and other terminals, and simplify the wire connection works with respect to the semiconductor module 102 with the size kept compact.

In addition, in this fourth embodiment, the low-sided terminal 155 is arranged to the one side of the second side surface 125a2 of the mold package 125, and the middle-sided terminal 150 is arranged to the other end of the second side surface 125a2 thereof so that it is possible to keep the battery wires connected to the low-sided terminal 155 away from the output wires connected to the middle-sided terminal 150.

Furthermore, in this fourth embodiment, the second high-sided chip (diode chip) 105, the first high-sided chip (IGBT chip) 104, the second low-sided chip (diode chip) 111, and the first low-sided chip (IGBT chip) 110 are aligned in the longitudinal direction of the middle-sided plate 103, and the second high-sided chip 105 and the first high-sided chip 104 are adjacent to each other, and the second low-sided chip 111 and the first low-sided chip 110 are adjacent to each other.

Therefore, this alignment structure requires that the longitudinal direction of the middle-sided plate 103 is sufficiently long, thereby maintaining the sufficient interval between each of the low-current terminals 131, 141 and the middle-sided terminal 150.

Figure 22:
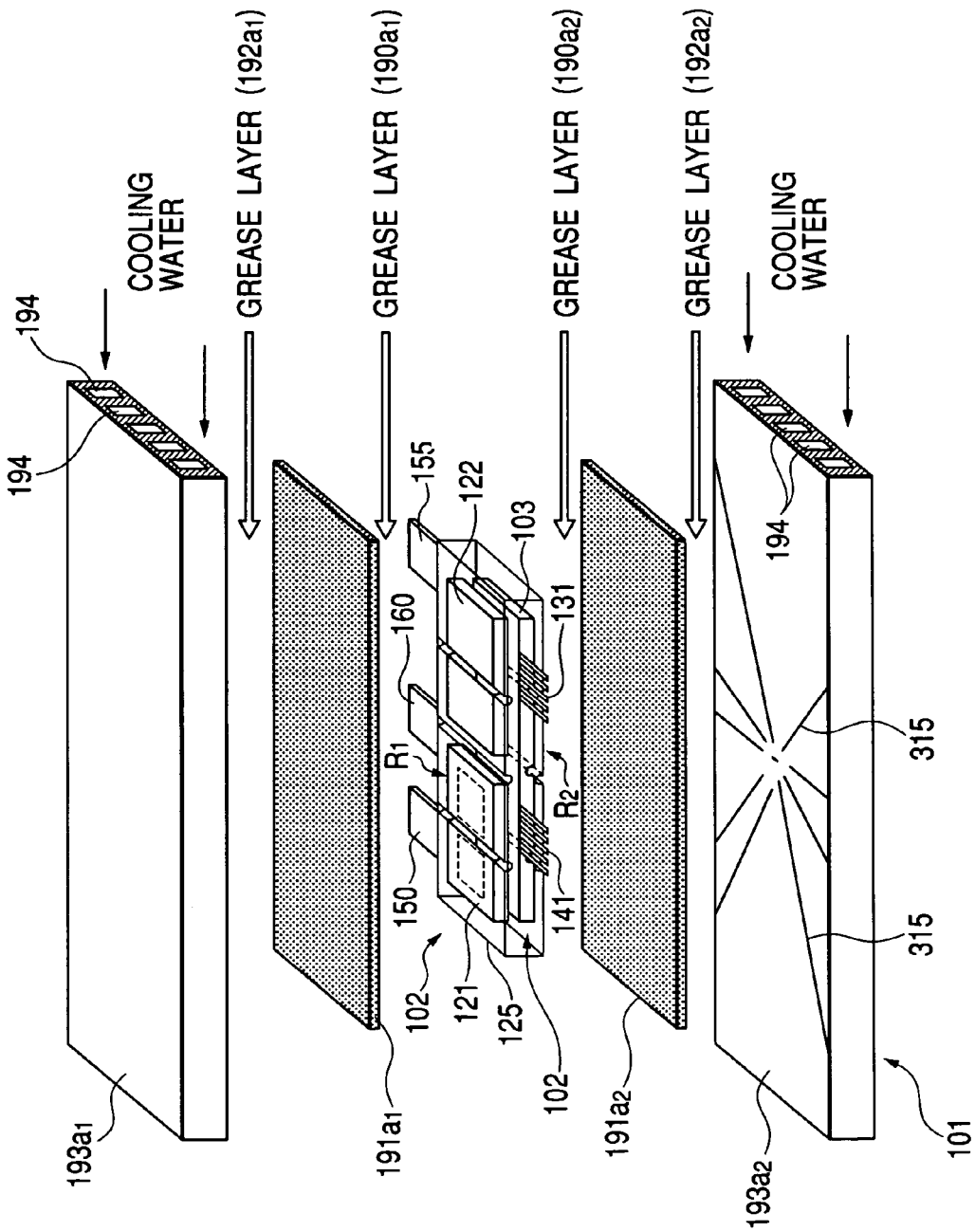
FIG. 22 is a perspective view of a semiconductor device according to a modification of the fourth embodiment.

Incidentally, in this fourth embodiment, as shown in FIG. 22, grease extrusion grooves 315 may be formed concavely on a top surface of the second cooling plate 193a2, in the same manner as the first embodiment, making it possible to smoothly extrude excess grease member between the second cooling plate 193a2 and the second insulating film 191a2, thereby preventing the excess grease members from remaining in the region therebetween. Similarly, grease extrusion grooves may be formed concavely on a bottom surface of the first cooling plate 193a1, making it possible to smoothly extrude excess grease member between the first cooling plate 193a1 and the first insulating film 191a1, thereby preventing the excess grease members from remaining in the region therebetween.

Figure 23:
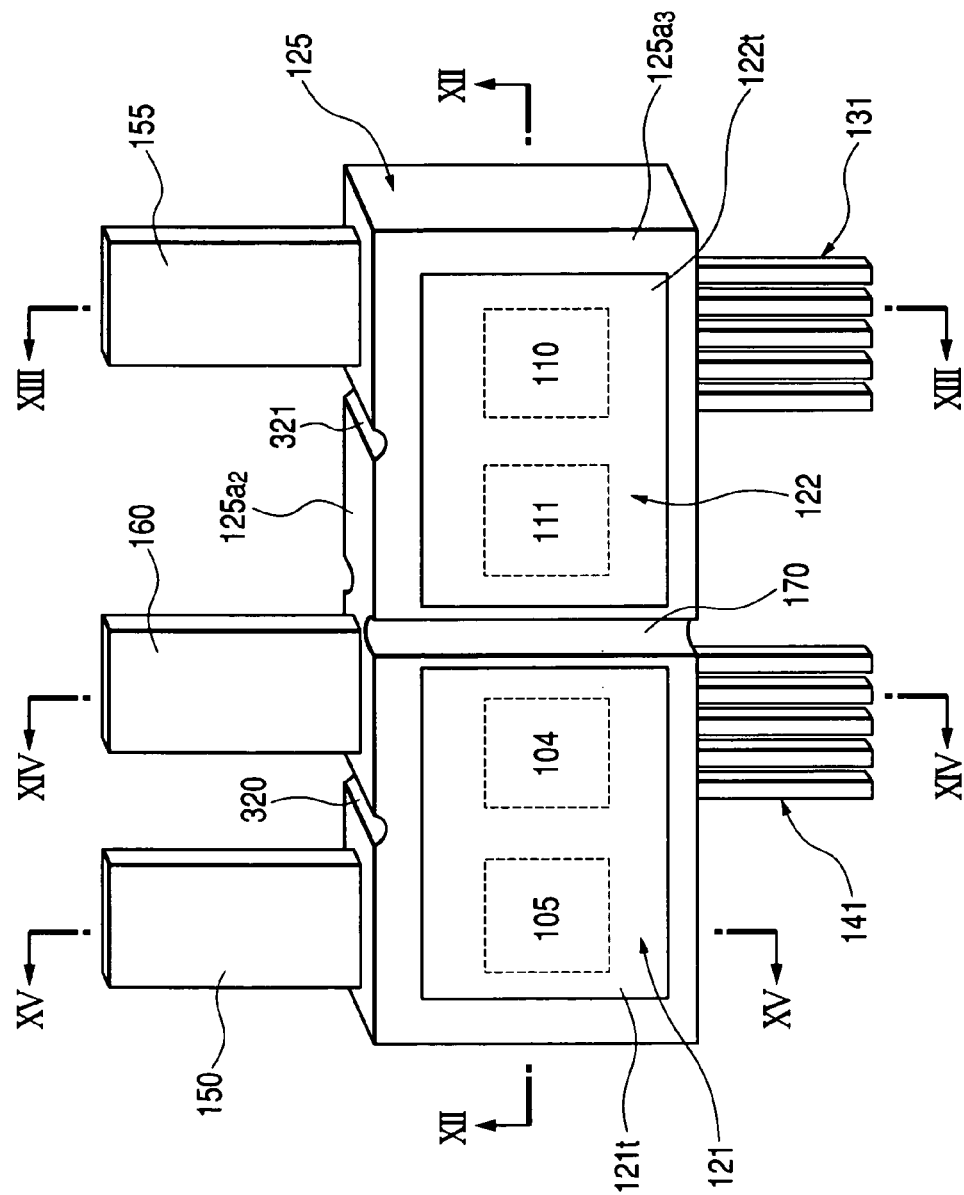
FIG. 23 is a perspective view illustrating a semiconductor module according to a modification of the fourth embodiment.
Figure 24:
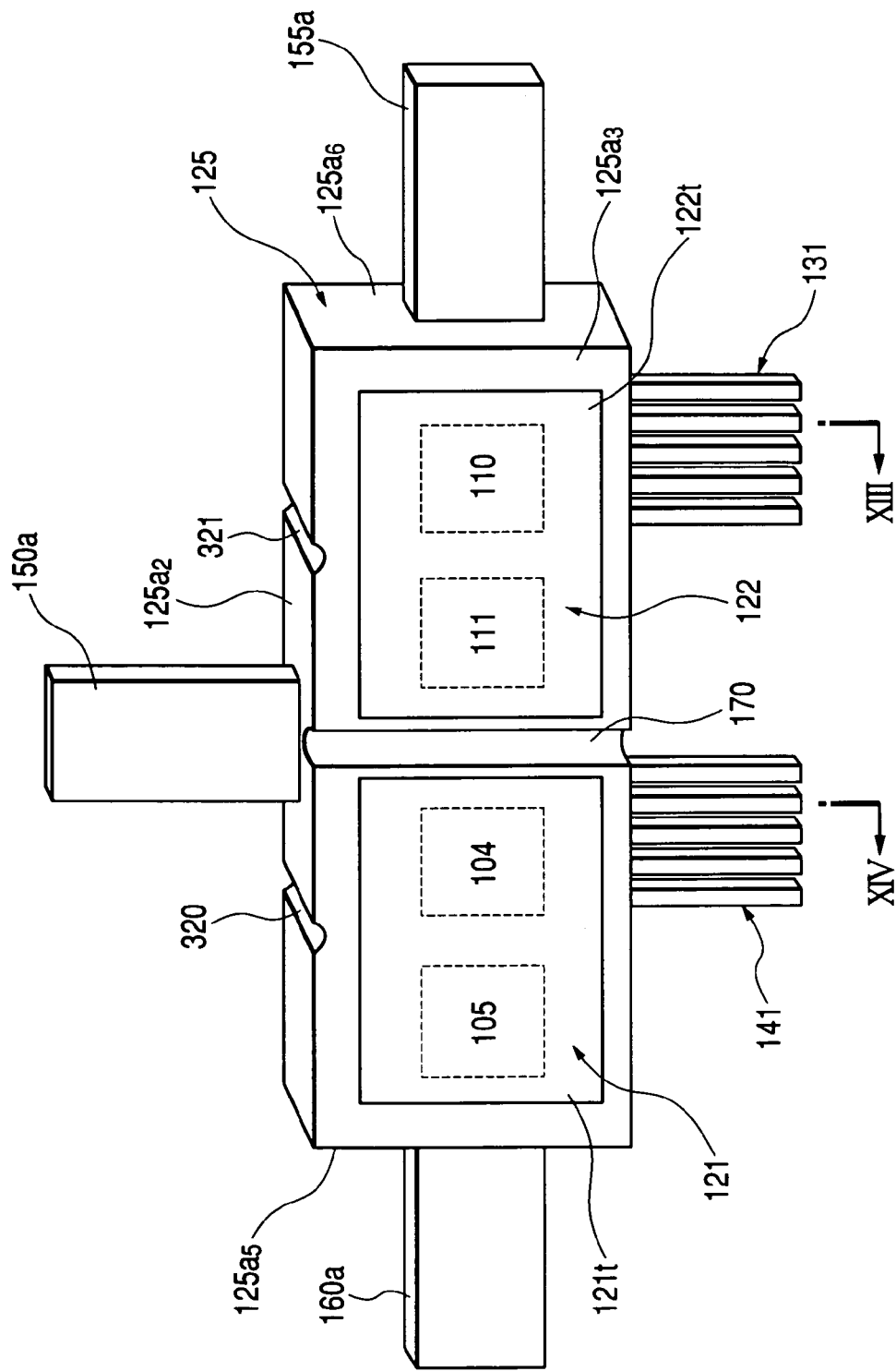
FIG. 24 is a perspective view illustrating a semiconductor module according to another modification of the fourth embodiment.

In modification of the fourth embodiment, as shown in FIG. 23, a first groove 320 is concavely formed on a portion of the second side surface 125a2 of the mold package 125, portion which is located between the middle-sided terminal 150 and the high-sided terminal 160, and a second groove 321 is concavely formed on a portion of the second side surface 125a2 of the mold package 125, portion which is located between the high-sided terminal 160 and the low-sided terminal 155, in place of or in addition to the fourth grease extrusion grooves 180a1 to 180a5.

Other structure is identical to the structure of the semiconductor device according to the fourth embodiment.

According to this modification, the first groove 320 permits the creepage distance between the middle-sided terminal 150 and the high-sided terminal 160 on the second side surface 125a2 to increase as compared with having no groove 320 therebetween, thereby preventing the creepage discharge on the second side surface 125a2 between the middle-sided terminal 150 and the high-sided terminal 160.

Similarly, the second groove 321 enables the creepage distance between the high-sided terminal 160 and the low-sided terminal 155 on the second side surface 125a2 to increase as compared with having no groove 321 therebetween, thereby preventing the creepage discharge on the second side surface 125a2 between the high-sided terminal 160 and the low-sided terminal 155.

In another modification of the fourth embodiment, the middle-sided terminal 150a is located on the center portion of the second side surface 125a2 of the mold package 125, the high-sided terminal 160a is located on a fifth side surface 125a5 of the mold package 125, which is one lateral side surface thereof, and the low-sided terminal 155a is located on a sixth side surface 125a6 of the mold package 125, which is other lateral side surface thereof.

Other structure is identical to the structure of the semiconductor device according to the fourth embodiment.

According to another modification, it is possible to enlarge the respective intervals among the high-sided terminal 160, the low-sided terminal 155, the middle-sided terminal 150, and the low current terminals 131, 141, thereby preventing the creepage discharge on the mold package 125 thereamong, and simplifying the wire connection layout and the wire connection works with respect to the semiconductor device according to the modification.

Figure 25A:
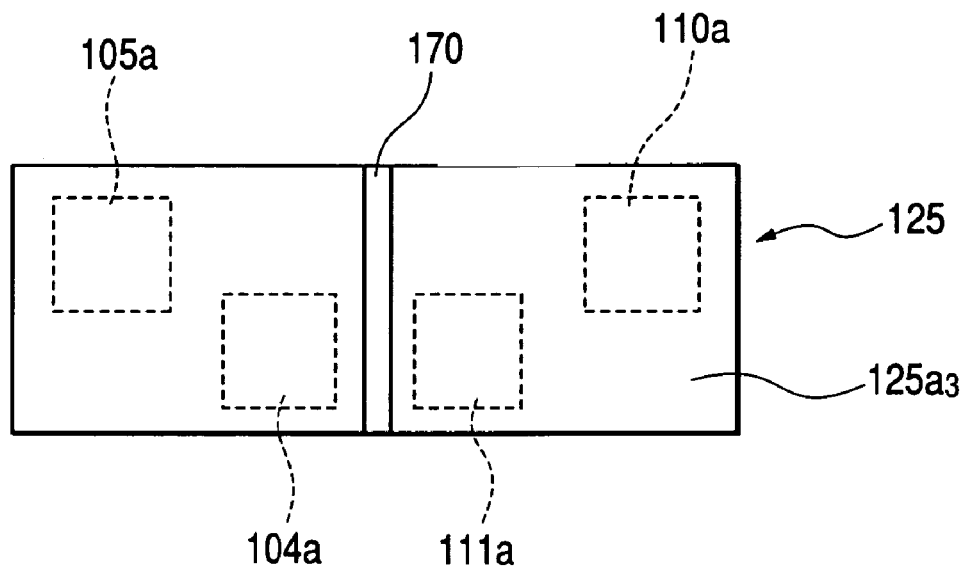
FIG. 25A is a schematic view of a third side surface of the mold package according to still further modification of the fourth embodiment.

In further modification of the fourth embodiment, as shown in FIG. 25A, the first high-sided chip (IGBT chip) 104a and the second high-sided chip (diode chip) 105a are obliquely arranged with respect to the longitudinal direction, and the first low-sided chip (IGBT chip) 110a and the second low-sided chip (diode chip) 111a are obliquely arranged with respect to the longitudinal direction. That is, the IGBT chip 104a and the diode chip 111a are opposite to each other in the longitudinal direction, and the diode chip 105a and the IGBT chip 110a are opposite to each other in the longitudinal direction.

This arrangement allows the distance between the center of the heat radiation area of the IGBT chip 104a and that of the heat radiation area of the diode chip 105a, making is possible to improve the radiating ability of the semiconductor device.

Figure 25B:
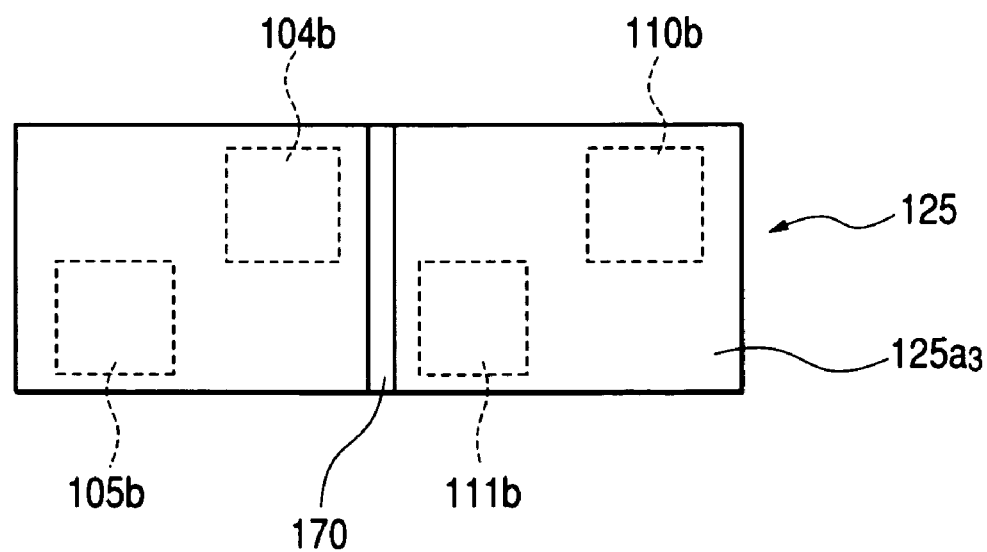
FIG. 25B is a schematic view of a third side surface of the mold package according to still further modification of the fourth embodiment.

In still further modification of the fourth embodiment, as shown in FIG. 25B, the IGBT chip 104b and the diode chip 105b are obliquely arranged with respect to the longitudinal direction, the IGBT chip 110b and the diode chip 111b are obliquely arranged with respect to the longitudinal direction, and the diode chip 111b and the IGBT chip 104b are obliquely arranged with respect to the longitudinal direction.

That is, the IGBT chip 104b and the IGBT chip 110b are opposite to each other in the longitudinal direction, and the diode chip 105b and the IGBT chip 111b are opposite to each other in the longitudinal direction.

This arrangement allows the distance between the center of the heat radiation area of the IGBT chip 104b and that of the heat radiation area of the diode chip 111b at, making is possible to improve the radiating ability of the semiconductor device.

Incidentally, in the fourth embodiment of the above modifications, a MOS (Metal Oxide Semiconductor) transistor chip, a pair of IGBT chip and a flywheel diode chip or the like may be used as at least one of the semiconductor chips.

In addition, in the fourth embodiment of the above modifications, the semiconductor module contains the single-phase circuit of the three-phase inverter circuit, but the present invention is not limited to the application.

That is, the semiconductor module may contain another electrical circuit, and the semiconductor device may be applied to another electrical circuit, such as converter circuit, or the like.

While there has been described what is at present considered to be the embodiment and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2002-374434 filed on Dec. 25, 2002, and the prior Japanese Patent Application 2003-106831 filed on Apr. 10, 2003 so that the contents of which are incorporated herein by reference.

What is claimed is:

1. A semiconductor device comprising:
a semiconductor module containing a semiconductor element and having a radiating portion;
a heat absorbing member having a heat absorbing portion with heat conductivity;
a grease member interposed between the radiating portion of the semiconductor module and the heat absorbing portion of the heat absorbing member, said radiating portion and heat absorbing portion being opposite and close to each other through the grease member in a predetermined direction; and
a grease extrusion path having one end and other end portions and formed in at least one of the radiating portion and the heat absorbing portion,
said one end portion of the grease extrusion path being configured to contact the grease member, said other end portion thereof communicating with an exterior of the at least one of the radiating portion and the heat absorbing portion.

2. The semiconductor device according to claim 1, wherein said semiconductor element has one surface opposite to a first area of the heat radiating portion, said first area of the heat radiating portion is opposite to a second area of the heat absorption portion in the predetermined direction, said grease extrusion path includes a grease extrusion groove formed in the at least one of the radiating portion and the heat absorbing portion, and said grease extraction groove is positioned except for the first and second areas.

3. The semiconductor device according to claim 2, wherein said grease extrusion path includes a plurality of grease extrusion grooves formed in the radiating portion of the semiconductor module, and said grease extrusion grooves surround the first area of the radiating portion.

4. The semiconductor device according to claim 1, wherein said grease extrusion path includes a grease extrusion hole formed in the heat absorption member, said grease extrusion hole being parallel to the predetermined direction.

5. The semiconductor device according to claim 3, wherein said semiconductor module comprises a mold package having one end surface opposite to the heat absorption portion, said semiconductor element is contained in the mold package, said radiating portion includes a radiating metal plate having one and other plate surfaces, said one plate surface of the radiating metal plate is mounted on the one end surface of the mold package, said grease member is mounted on the other plate surface of the radiating metal plate, and said extrusion grooves are formed on the other plate surface of the radiating metal plate, each of said other end portions of each of the extrusion grooves extending toward a peripheral portion of the radiating metal plate.

6. The semiconductor device according to claim 1, wherein said semiconductor module comprises a mold package containing the semiconductor element, said radiating portion includes one end surface of the mold package, said one end surface of the mold package is opposite to the heat absorption portion, said one end surface of the mold package includes an exposed radiating portion and a mold surface portion that are flush with each other, said grease member is mounted on the one end surface of the mold package, and wherein said extrusion path includes a grease extrusion groove formed on the at least one of the one end surface of the mold package and the heat absorption member.

7. The semiconductor device according to claim 6, wherein said exposed radiating portion includes at least two exposed radiating portions so that the mold surface portion is located between the at least two exposed radiating portions, and said grease extrusion groove is formed on the mold surface portion between the at least two exposed radiating portions.

8. A semiconductor device comprising:
a semiconductor module containing at least two semiconductor elements and having first and second radiating portions;
a heat absorbing member having first and second heat absorbing portions each with heat conductivity;
a first grease member interposed between the first radiating portion of the semiconductor module and the first heat absorbing portion of the heat absorbing member, said first radiating portion and first absorbing portion being opposite and close to each other through the first grease member in a predetermined direction;
a second grease member interposed between the second radiating portion of the semiconductor module and the second heat absorbing portion of the heat absorbing member, said second radiating portion and second absorbing portion being opposite and close to each other through the second grease member in the predetermined direction;
a first grease extrusion path having one end and other end portions and formed in at least one of the first radiating portion and the first heat absorbing portion,
said one end portion of the first grease extrusion path being configured to contact the first grease member, said other end portion thereof communicating with an exterior of the at least one of the first radiating portion and the first heat absorbing portion; and a second grease extrusion path having one end and other end portions and formed in at least one of the second radiating portion and the second heat absorbing portion,
said one end portion of the second grease extrusion path being configured to contact the second grease member, said other end portion thereof communicating with an exterior of the at least one of the second radiating portion and the second heat absorbing portion.

9. The semiconductor device according to claim 8, wherein said first grease extrusion path and the second grease extrusion path are opposite to each other in the predetermined direction.

10. A semiconductor module containing at least first and second semiconductor chips of an electric circuit, comprising:
a first electric plate with a mount surface on which the first and second semiconductor chips are mounted, respectively, said first electric plate having first and second longitudinal side surfaces opposite to each other;
a second electric plate mounted on the first semiconductor chip, said second electric plate having first and second side surfaces opposite to each other and parallel to the first and second longitudinal side surfaces, respectively;
a third electric plate mounted on the second semiconductor chip, said third electric plate having first and second side surfaces opposite to each other and parallel to the first and second longitudinal side surfaces, respectively;
a first electric terminal projecting from one end portion of the first longitudinal side surface of the first electric plate in a lateral direction thereof, said first electric terminal constituting an alternate current terminal of the electric circuit;
a second electric terminal projecting from a first portion of the first side surface of the second electric plate in the lateral direction, said first portion being spaced with respect to the one end portion in the longitudinal direction, said second electric terminal constituting a high-sided current terminal of the electric circuit;
a third electric terminal projecting from a second portion of the first side surface of the third electric plate in the lateral direction, said second portion being spaced with respect to the one end portion and the first portion in the lateral direction, said third electric terminal constituting a low-sided current terminal of the electric circuit;
a mold package having a first side surface corresponding to the first longitudinal side surface of the first electric plate and a second side surface corresponding to the second longitudinal side surface thereof, said mold package containing the first to third electric plates, the first and second semiconductor chips, respectively;
a first low current terminal electrically connected to one of the first and second semiconductor chips and projecting from the second side surface of the mold package; and
a second low current terminal electrically connected to other of the first and second semiconductor chips and projecting from the second side surface of the mold package.

11. The semiconductor module according to claim 10, wherein said mold package comprises first and second surfaces which are opposite to the mount surface of the first electric plate, respectively, and at least one of said first and second surfaces is formed at its predetermined portion with a groove, said predetermined portion being located between the second electric plate and the third electric plate.

12. The semiconductor module according to claim 11, wherein said groove extends between the first and second side surfaces of the mold package.

13. The semiconductor module according to claim 10, wherein at least one of said first and second surfaces of the mold package is formed with a groove between adjacent terminals in the first, second, and third electric terminals.

14. The semiconductor module according to claim 10, wherein said electric circuit is a half bridge circuit, said first semiconductor chip is an upper arm semiconductor chip of the half bridge circuit and the second semiconductor chip is a lower arm semiconductor chip thereof.

15. The semiconductor module according to claim 14, wherein said upper arm semiconductor chip and said lower arm semiconductor chip are aligned in the longitudinal direction of the first electric plate.

16. The semiconductor module according to claim 14, wherein said upper arm semiconductor chip includes a first transistor chip and a first diode chip, said lower arm semiconductor chip includes a second transistor chip and a second diode chip, and
wherein said first transistor chip, said first diode chip, said second transistor chip, and said second diode chip are aligned in the longitudinal direction of the first electric plate, said first transistor chip being adjacent to the first diode chip, said second transistor chip being adjacent to the second diode chip.

17. A semiconductor module containing at least first and second semiconductor chips of an electric circuit, comprising:
a first electric plate with a mount surface on which the first and second semiconductor chips are mounted, respectively, said first electric plate having first, second, third and fourth side surfaces;
a second electric plate mounted on one of the semiconductor chips, said second electric plate having first, second, third and fourth side surfaces parallel to the first, second, third and fourth side surfaces of the first electric plate, respectively;
a third electric plate arranged in parallel to the first electric plate and mounted on another one of the semiconductor chips, said third electric plate having first, second, third and fourth side surfaces parallel to the first, second, third and fourth side surfaces of the first electric plate, respectively;
a first electric terminal projecting from one of the first, second, third and fourth side surfaces of the first electric plate in a lateral direction thereof, said first electric terminal constituting an alternate current terminal of the electric circuit;
a second electric terminal projecting from one of the first, second, third and fourth side surfaces of the second electric plate in the lateral direction, said second electric terminal constituting a high-sided current terminal of the electric circuit;
a third electric terminal projecting from one of the first, second, third and fourth side surfaces of the third electric plate in the lateral direction, said third electric terminal constituting a low-sided current terminal of the electric circuit;
a mold package having first, second, third and fourth side surfaces corresponding to the first, second, third and fourth side surfaces of the first electric plate, said mold package containing the first to third electric plates, the first and second semiconductor chips, respectively;
a first low current terminal electrically connected to one of the first and second semiconductor chips; and
a second low current terminal electrically connected to other of the first and second semiconductor chips,
wherein said first electric terminal, second electric terminal, third electric terminal, and each of the first and second low current terminals project independently through the first, second, third, and fourth side surfaces of the mold package, respectively.

18. The semiconductor module according to claim 17, wherein said mold portion comprises first and second surfaces which are opposite to the mount surface of the first electric plate, respectively, and at least one of said first and second surfaces is formed at its predetermined portion with a groove, said predetermined portion being located between the second electric plate and the third electric plate.

19. The semiconductor module according to claim 18, wherein said groove extends between the first and second side surfaces of the mold package.

20. The semiconductor module according to claim 17, wherein at least one of said first and second surfaces of the mold package is formed with a groove between adjacent terminals in the first, second, and third electric terminals.

21. The semiconductor module according to claim 17, wherein said electric circuit is a half bridge circuit, said first semiconductor chip is an upper arm semiconductor chip of the half bridge circuit and the second semiconductor chip is a lower arm semiconductor chip thereof.

22. The semiconductor module according to claim 21, wherein said upper arm semiconductor chip and said lower arm semiconductor chip are aligned in the longitudinal direction of the first electric plate.

23. The semiconductor module according to claim 21, wherein said upper arm semiconductor chip includes a first transistor chip and a first diode chip, said lower arm semiconductor chip includes a second transistor chip and a second diode chip, and
wherein said first transistor chip, said first diode chip, said second transistor chip, and said second diode chip are aligned in the longitudinal direction of the first electric plate, said first transistor chip being adjacent to the first diode chip, said second transistor chip being adjacent to the second diode chip.

* * * * *